(12) United States Patent
Hiromasu et al.

(10) Patent No.: US 10,109,650 B2
(45) Date of Patent: Oct. 23, 2018

(54) SEMICONDUCTOR DEVICE AND ACTIVE MATRIX SUBSTRATE USING SEMICONDUCTOR DEVICE

(71) Applicant: JOLED Inc., Tokyo (JP)

(72) Inventors: Yasunobu Hiromasu, Tokyo (JP); Motohiro Toyota, Tokyo (JP); Shinichi Ushikura, Tokyo (JP)

(73) Assignee: JOLED INC., Tokyo (JP)

( * ) Notice: Subject to any disclaimer, the term of this patent is extended or adjusted under 35 U.S.C. 154(b) by 26 days.

(21) Appl. No.: 15/466,827

(22) Filed: Mar. 22, 2017

(65) Prior Publication Data

US 2017/0287946 A1    Oct. 5, 2017

(30) Foreign Application Priority Data

Apr. 1, 2016  (JP) .................................. 2016-074368
Apr. 12, 2016 (JP) .................................. 2016-079641

(51) Int. Cl.
| | |
|---|---|
| *H01L 27/12* | (2006.01) |
| *H01L 27/02* | (2006.01) |
| *H01L 27/32* | (2006.01) |
| *H01L 29/786* | (2006.01) |
| *H01L 29/423* | (2006.01) |

(52) U.S. Cl.
CPC ...... *H01L 27/1225* (2013.01); *H01L 27/0266* (2013.01); *H01L 27/124* (2013.01); *H01L 27/1248* (2013.01); *H01L 27/1255* (2013.01); *H01L 27/1288* (2013.01); *H01L 27/3262* (2013.01); *H01L 27/3265* (2013.01); *H01L 29/7869* (2013.01); *H01L 2029/42388* (2013.01)

(58) Field of Classification Search
CPC ............ H01L 27/1225; H01L 27/1255; H01L 27/1248; H01L 27/3262; H01L 27/3265; H01L 29/7869
See application file for complete search history.

(56) References Cited

U.S. PATENT DOCUMENTS

| | | | |
|---|---|---|---|
| 2011/0240998 A1 | 10/2011 | Morosawa et al. | |
| 2012/0249904 A1 | 10/2012 | Morosawa | |
| 2015/0076471 A1* | 3/2015 | Saito ................... | H01L 27/3262 257/40 |
| 2015/0115256 A1* | 4/2015 | You ..................... | H01L 27/3265 257/40 |
| 2016/0315107 A1 | 10/2016 | Morosawa | |

FOREIGN PATENT DOCUMENTS

| | | |
|---|---|---|
| JP | 2011-228622 A | 11/2011 |
| JP | 2012-212077 A | 11/2012 |

* cited by examiner

*Primary Examiner* — David Spalla
(74) *Attorney, Agent, or Firm* — Hauptman Ham, LLP

(57) ABSTRACT

According to one embodiment, a semiconductor device includes an insulating substrate including a pixel area and a peripheral circuit area around the pixel area, a first insulating layer which is provided on the insulating substrate and includes at least nitrogen, a second insulating layer at least provided on the first insulating layer of the peripheral circuit area, a first thin-film transistor which is provided above the first insulating layer of the pixel area and includes a first oxide semiconductor layer, and a second thin-film transistor which is provided on the second insulating layer of the peripheral circuit area and includes a second oxide semiconductor layer. The second insulating layer in the pixel area is thinner than that in the peripheral circuit area.

20 Claims, 36 Drawing Sheets

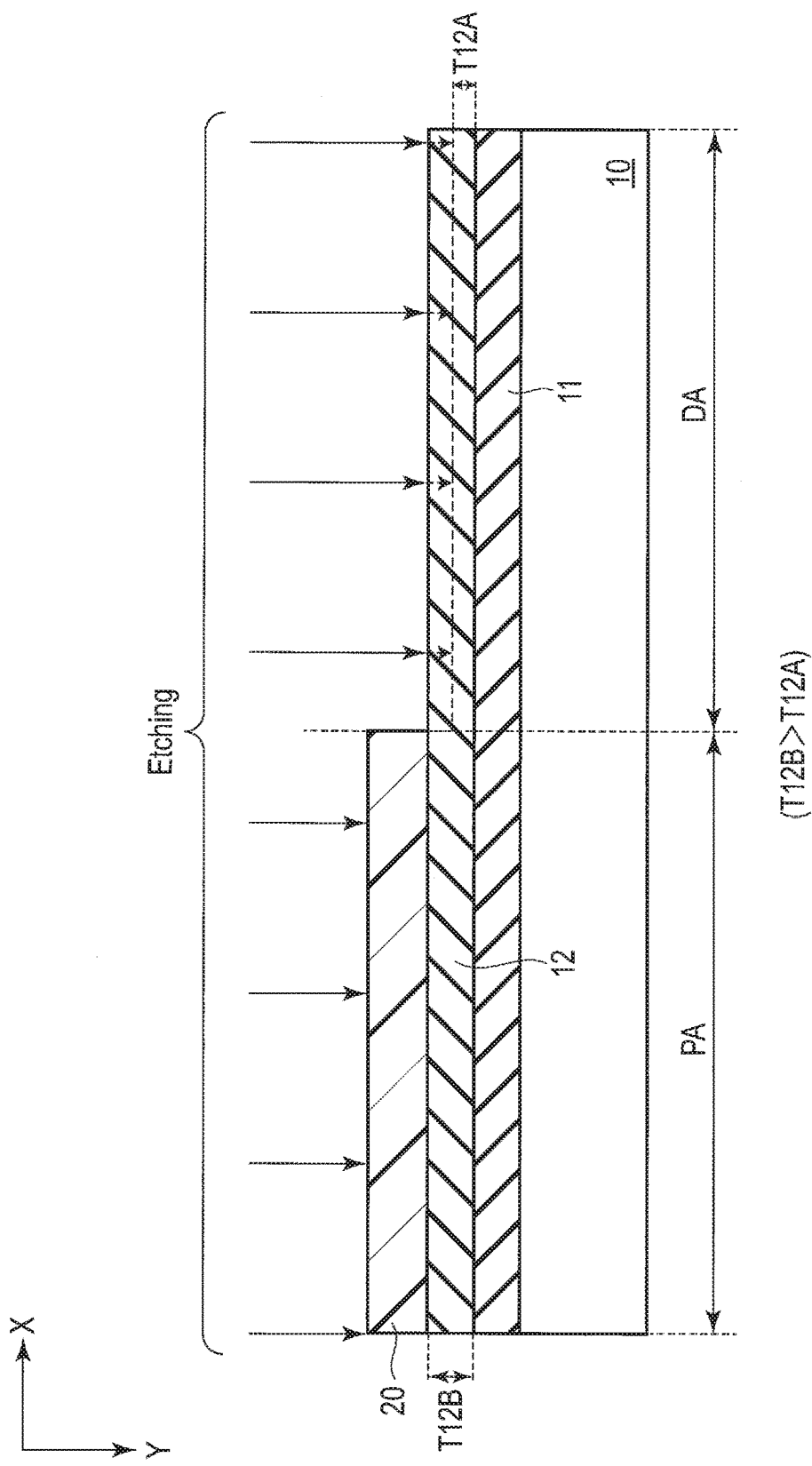
F I G. 4

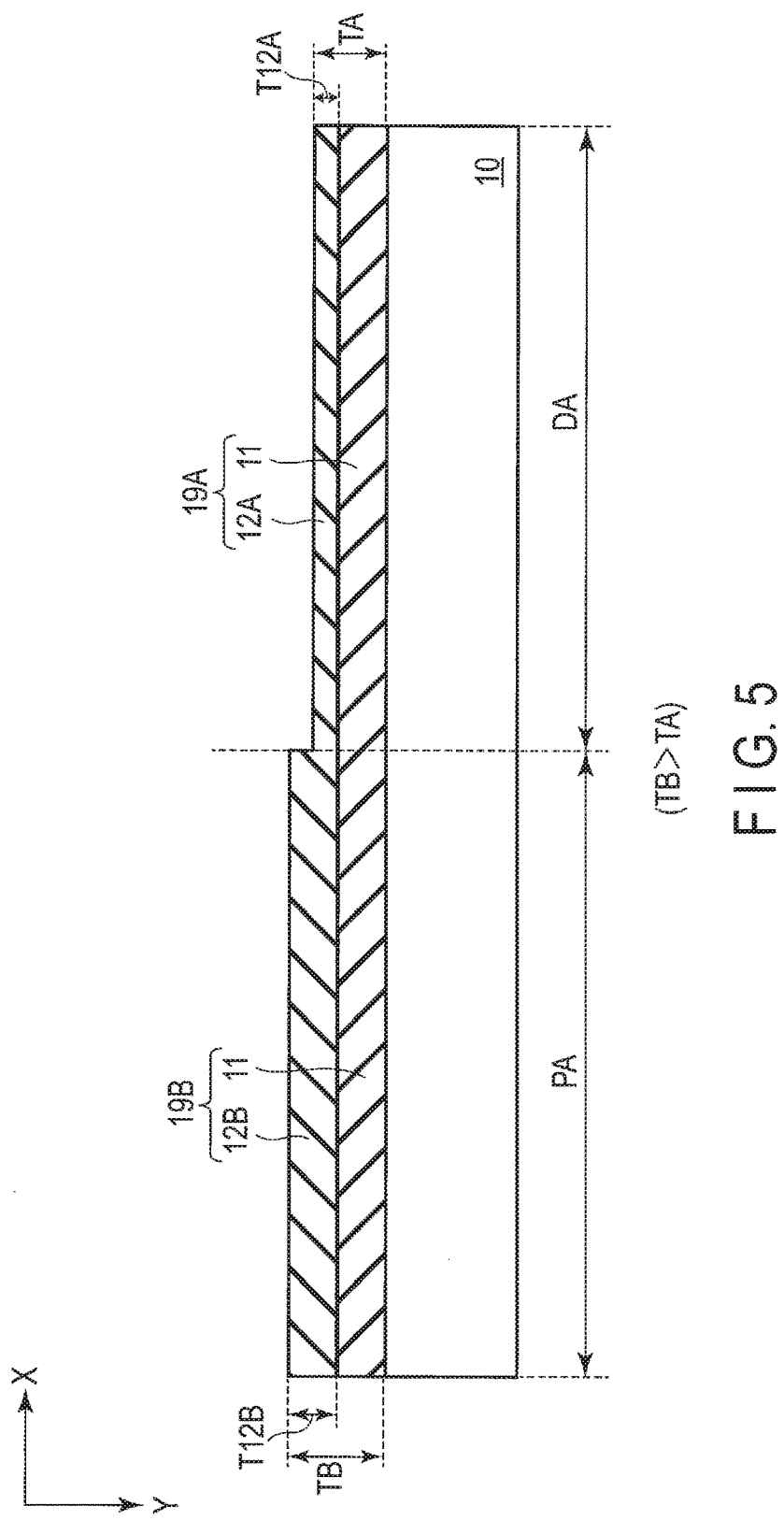
F I G. 5

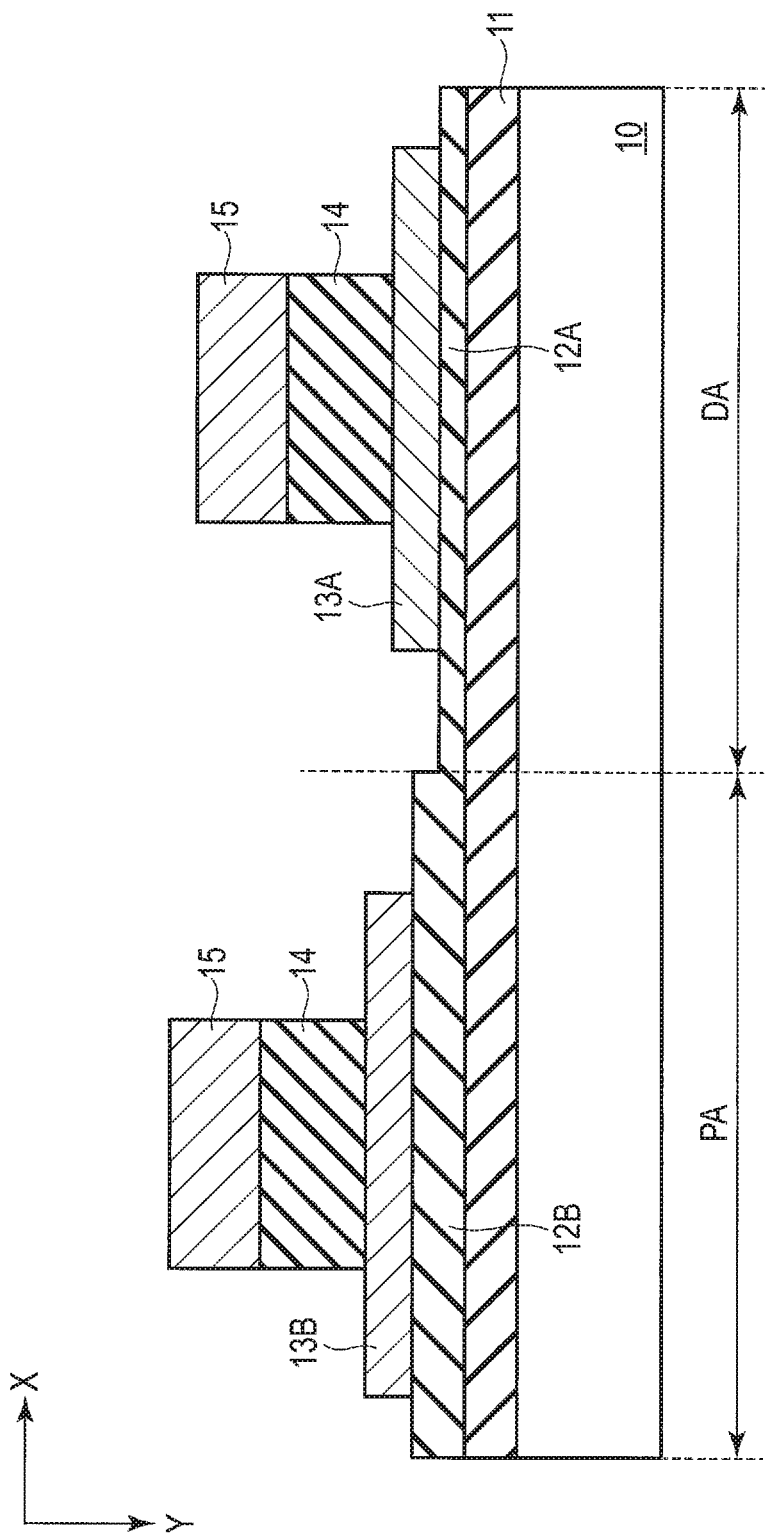
F I G. 7

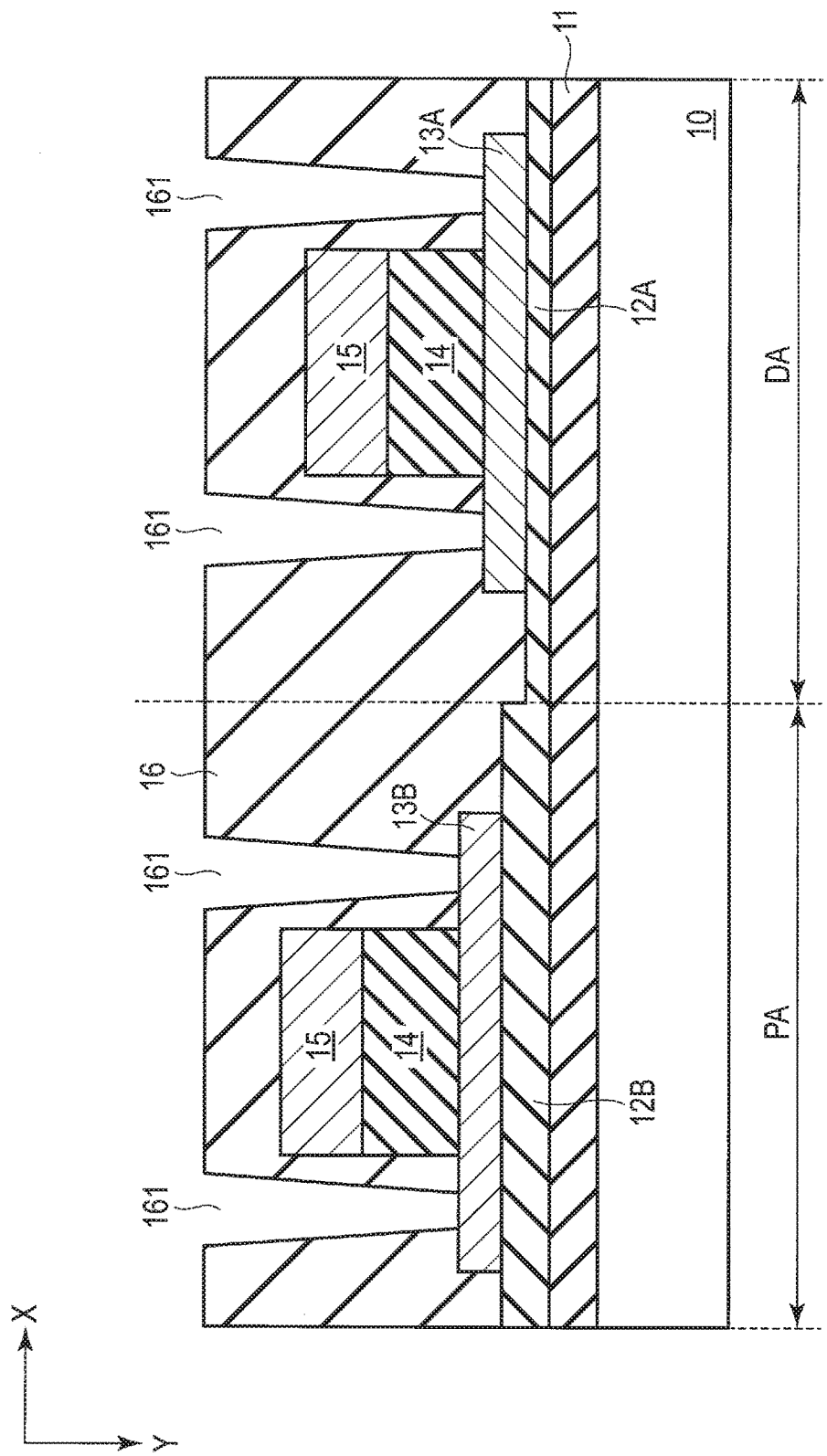
F I G. 8

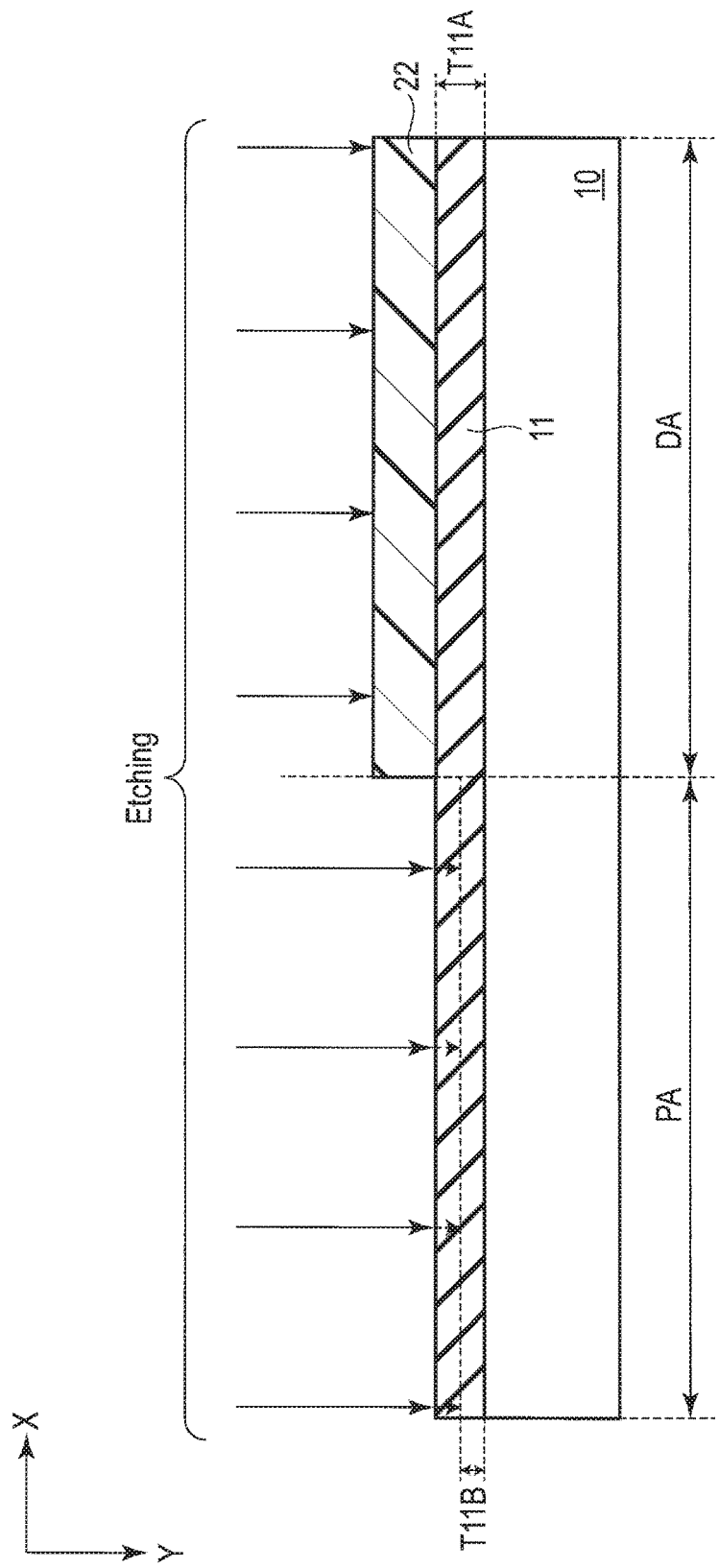
F I G. 15

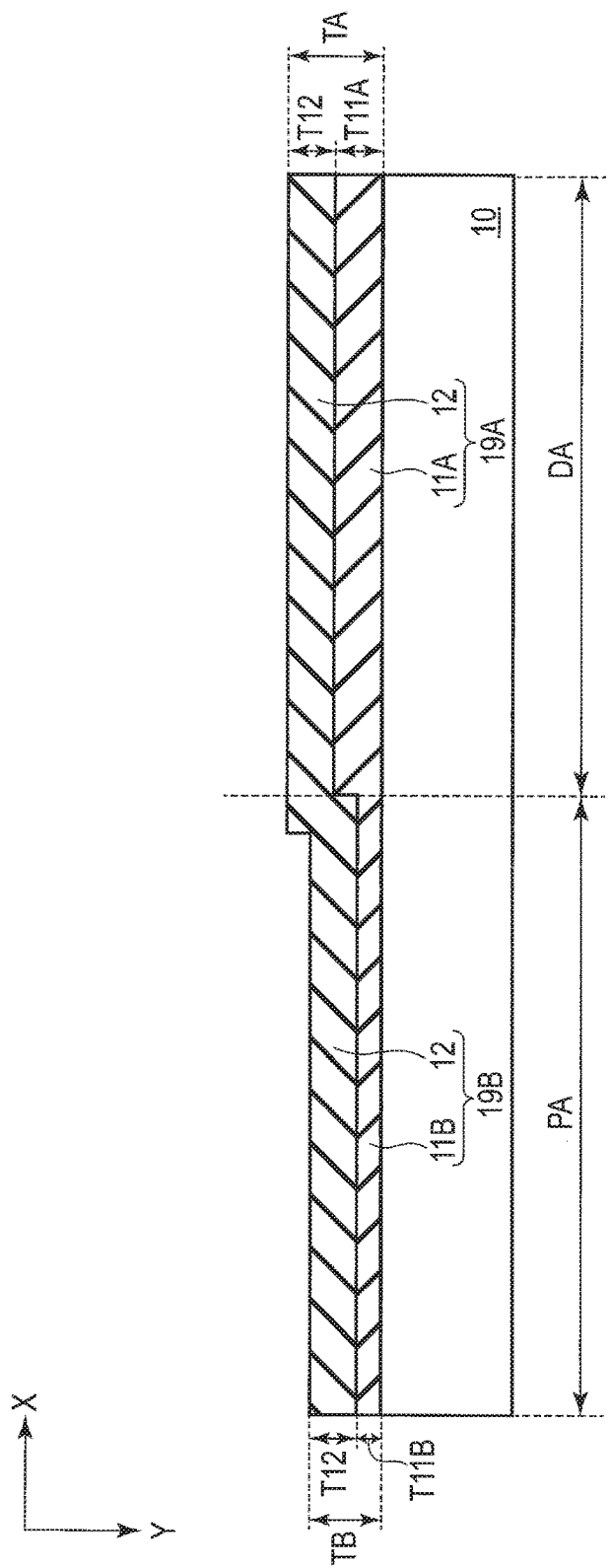
F I G. 17

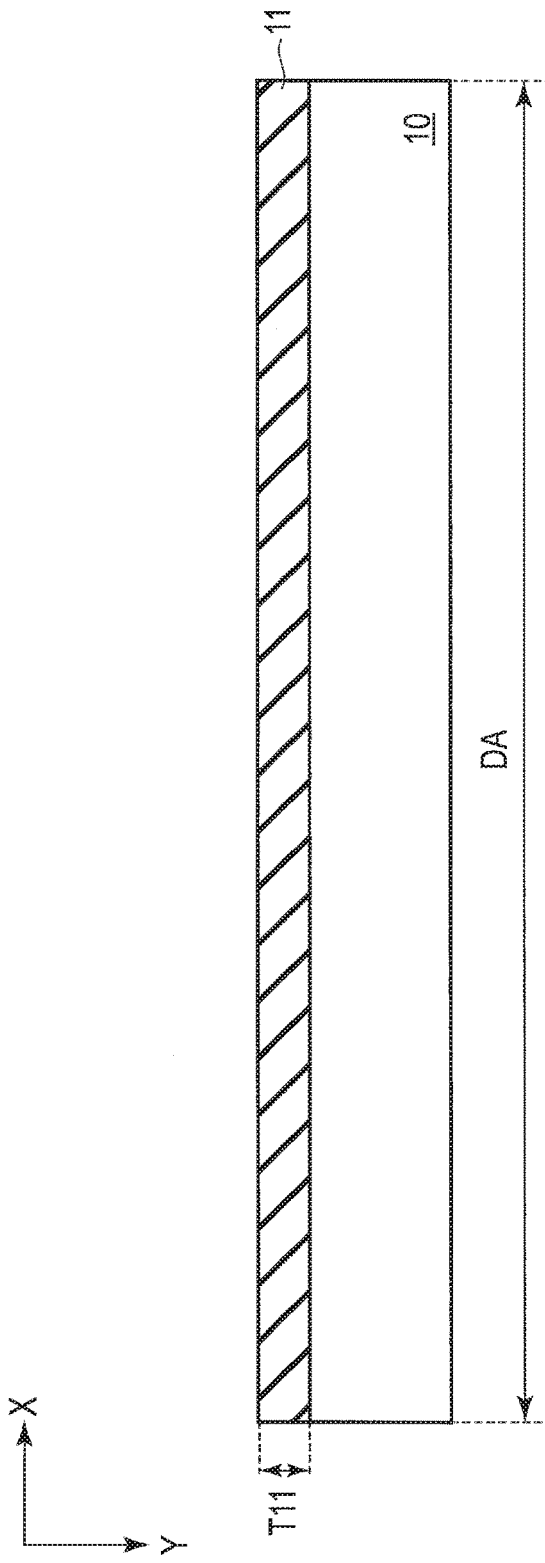
F I G. 20

(T12A>T12C)

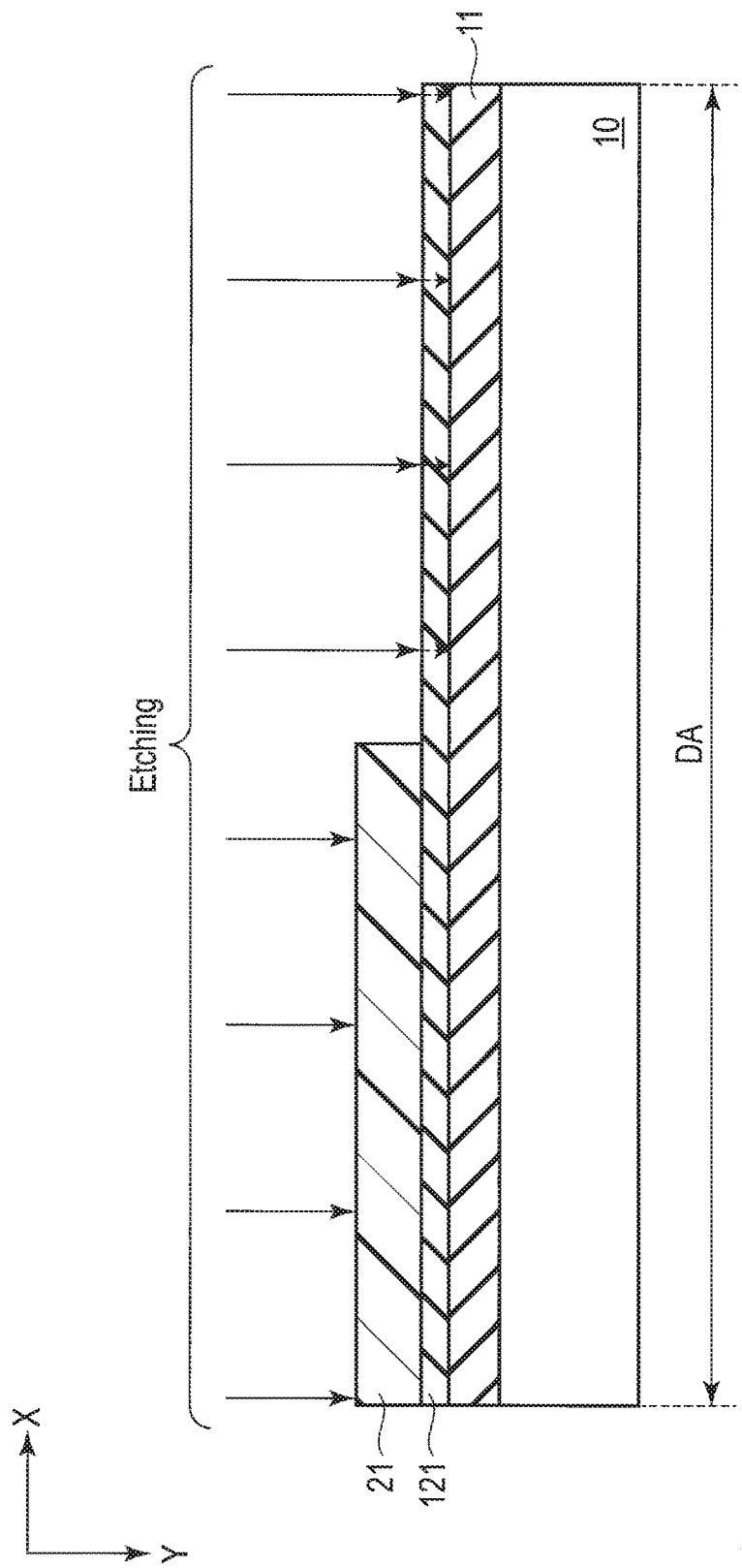
F I G. 28

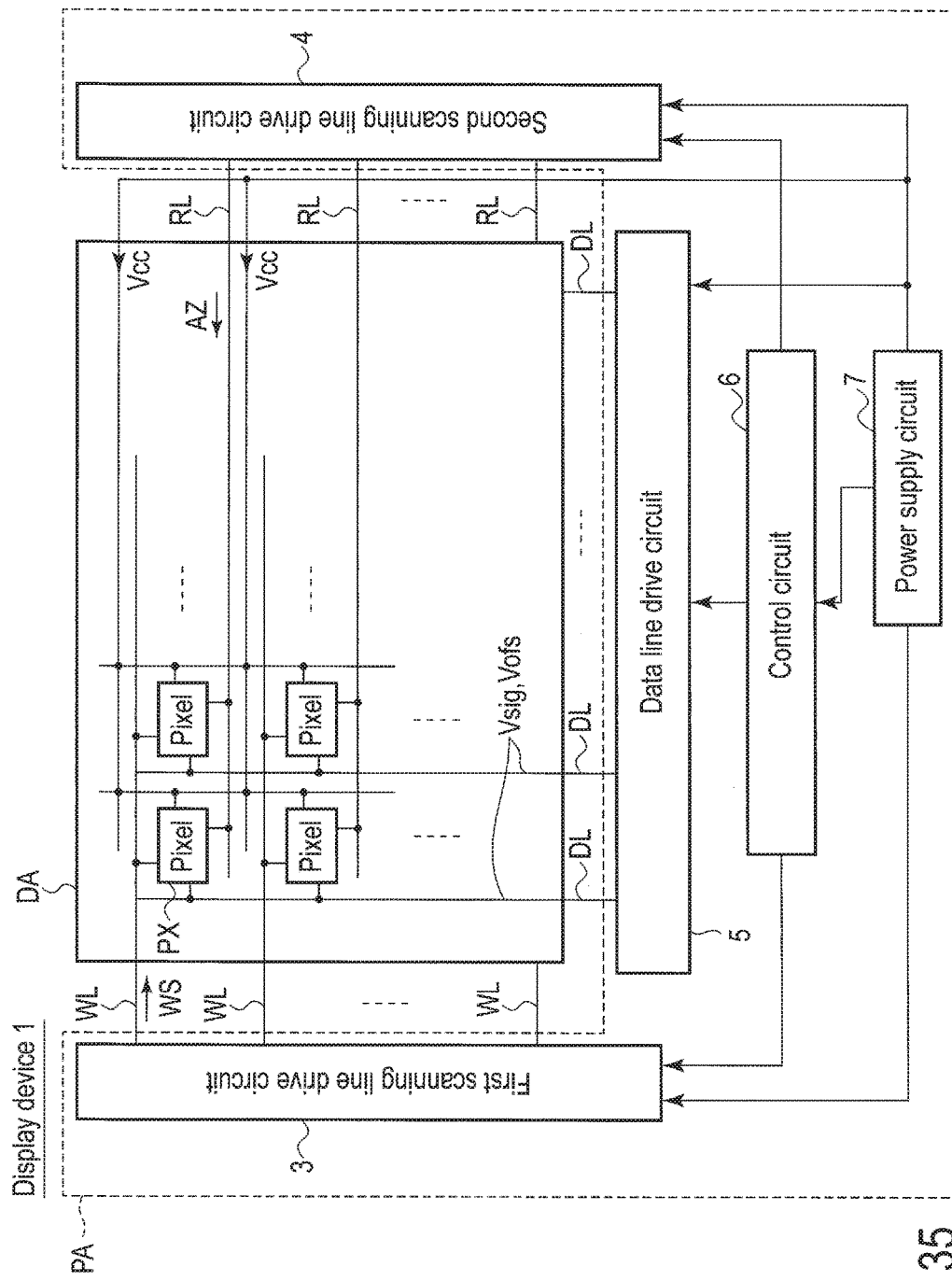
F I G. 35

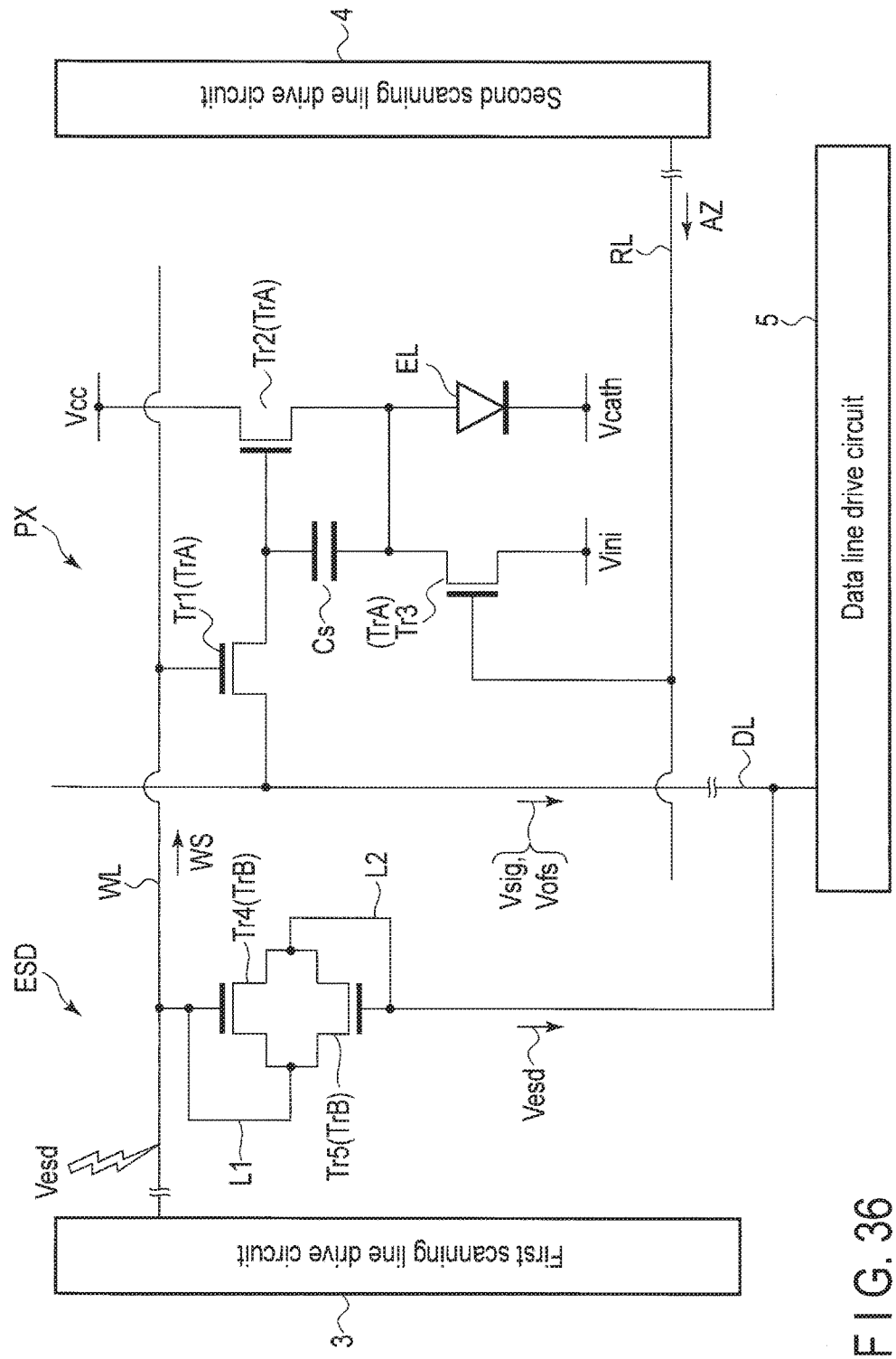
F I G. 36

SEMICONDUCTOR DEVICE AND ACTIVE MATRIX SUBSTRATE USING SEMICONDUCTOR DEVICE

CROSS-REFERENCE TO RELATED APPLICATIONS

This application is based upon and claims the benefit of priority from Japanese Patent Applications No. 2016-074368, filed Apr. 1, 2016; and No. 2016-079641, filed. Apr. 12, 2016, the entire contents of all of which are incorporated herein by reference.

FIELD

Embodiments described herein relate generally to a semiconductor device and an active matrix substrate using the semiconductor device.

BACKGROUND

A thin-film transistor and a capacitor are known as elements which constitute each pixel in a display device such as a television, a personal computer, a smartphone or a tablet terminal.

This type of display device is required to improve the image quality in the pixel area. In addition, it is important to reduce the electricity consumption of the semiconductor device and the active matrix substrate used for the display device.

In the above display device, when the capacitance of the capacitor has voltage dependence, the image quality in the pixel area may be degraded.

BRIEF DESCRIPTION OF THE DRAWINGS

FIG. 4 is a cross-sectional view showing a manufacturing step subsequent to FIG. 3.

FIG. 5 is a cross-sectional view showing a manufacturing step subsequent to FIG. 4.

FIG. 7 is a cross-sectional view showing a manufacturing step subsequent to FIG. 6.

FIG. 8 is a cross-sectional view showing a manufacturing step subsequent to FIG. 7.

FIG. 15 is a cross-sectional view showing an example of a method for manufacturing the semiconductor device shown in FIG. 14.

FIG. 17 is a cross-sectional view showing a manufacturing step subsequent to FIG. 16.

FIG. 20 is a cross-sectional view showing an example of a method for manufacturing the semiconductor device shown in FIG. 18.

FIG. 28 is a cross-sectional view showing a manufacturing step subsequent to FIG. 27.

FIG. 35 is a block diagram schematically showing an example of a display device to which an active matrix substrate using the semiconductor device of each of the first and second embodiments and modification examples 1 and 2 is applied.

FIG. 36 is an equivalent circuit diagram schematically showing an example of the pixel area and the peripheral circuit area shown in FIG. 35.

DETAILED DESCRIPTION

Figure 1:
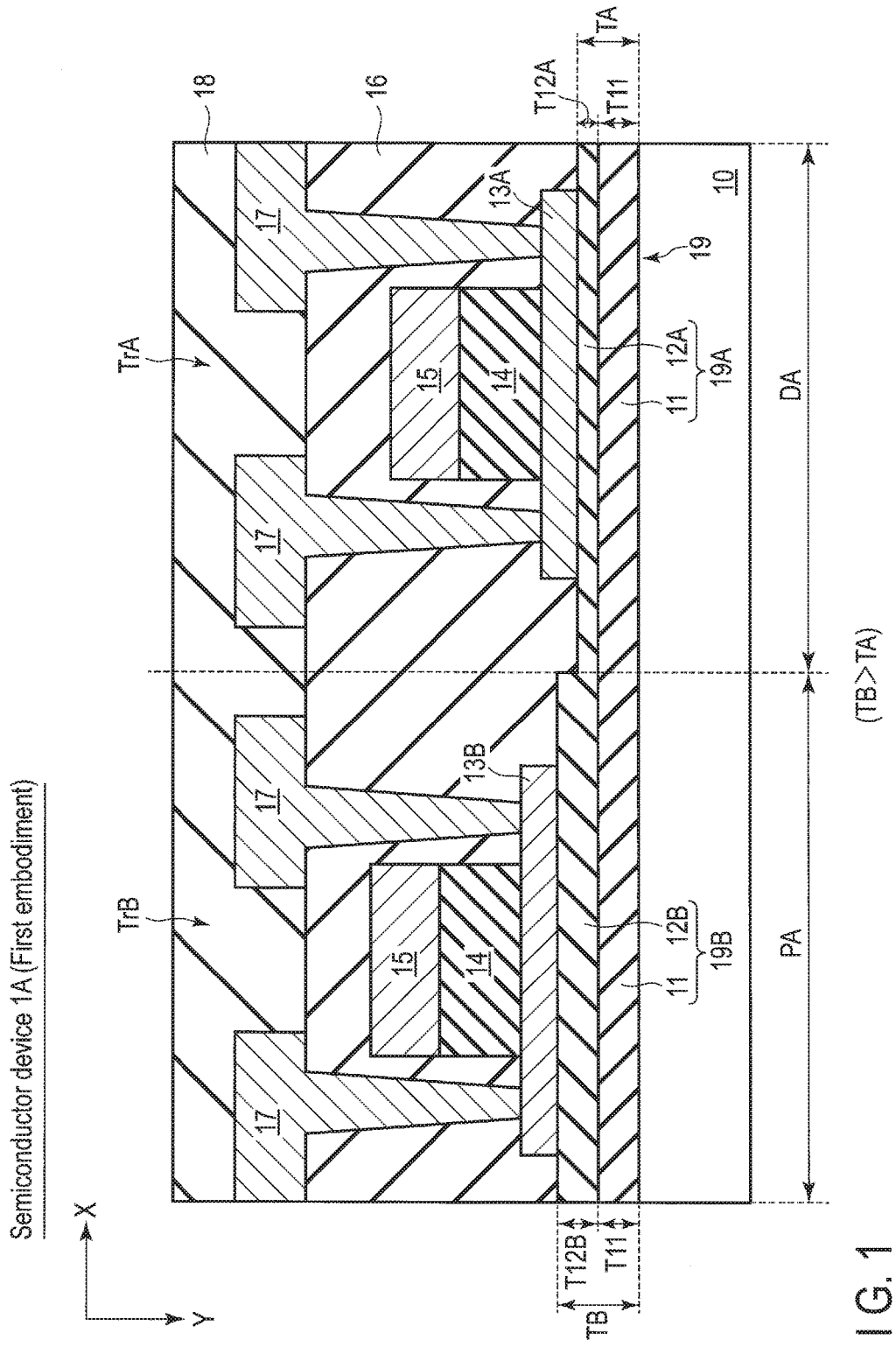
FIG. 1 is a cross-sectional view schematically showing an example of a semiconductor device applied to an active matrix substrate according to a first embodiment.

Embodiments described herein disclose a semiconductor device which is favorable for the reduction in the electricity consumption, and an active matrix substrate using the semiconductor device.

For example, according to one embodiment, a semiconductor device comprises an insulating substrate including a pixel area and a peripheral circuit area around the pixel area, a first insulating layer which is provided on the insulating substrate and includes at least nitrogen, a second insulating layer at least provided on the first insulating layer of the peripheral circuit area, a first thin-film transistor which is provided above the first insulating layer of the pixel area and comprises a first oxide semiconductor layer, and a second thin-film transistor which is provided on the second insulating layer of the peripheral circuit area and comprises a second oxide semiconductor layer. The second insulating in the pixel area is thinner than that in the peripheral circuit area.

For example, according to another embodiment, a semiconductor device comprises an insulating substrate including a pixel area and a peripheral circuit area around the pixel area, a first insulating layer which is provided on the insulating substrate and includes at least nitrogen, a second insulating layer provided on the first insulating layer, a first thin-film transistor which is provided on the second insulating layer of the pixel area and comprises a first oxide semiconductor layer, and a second thin-film transistor which is provided on the second insulating layer of the peripheral circuit area and comprises a second oxide semiconductor layer. The first insulating layer in the pixel area is thicker than that in the peripheral circuit area.

The embodiments described herein further disclose a semiconductor device which reduces the voltage dependence of the capacitance of a capacitor, and an active matrix substrate using the semiconductor device.

For example, according to yet another embodiment, a semiconductor device comprises an insulating substrate, a first insulating layer which is provided on the insulating substrate and includes at least nitrogen, a thin-film transistor which is provided above the first insulating layer and comprises a first oxide semiconductor layer, a capacitor which is provided above the first insulating layer and comprises a second oxide semiconductor layer, and a second insulating layer at least provided between the first insulating layer and the first oxide semiconductor layer of the thin-film transistor.

For example, according to yet another embodiment, a semiconductor device comprises an insulating substrate, a first insulating layer which is provided on the insulating substrate and includes at least nitrogen, a second insulating layer provided on the first insulating layer, a thin-film transistor which is provided on the second insulating layer and comprises a first oxide semiconductor layer, and a capacitor which is provided on the second insulating layer and comprises a second oxide semiconductor layer. The first insulating layer under the first oxide semiconductor layer is thinner than that under the second oxide semiconductor layer.

Various embodiments will be described hereinafter with reference to the accompanying drawings. In order to make the description clearer, the drawings are schematically shown. Thus, the widths, thicknesses, shapes, etc., of the respective parts may differ from those of the actual implementation. However, such schematic illustration in no way restricts the interpretation of the invention. In addition, in the specification and drawings, structural elements which function in the same or a similar manner to those described in connection with preceding drawings are denoted by like reference numbers, detailed description thereof being omitted unless necessary.

First Embodiment

With reference to FIG. 1 to FIG. 9, this embodiment explains a semiconductor device applied to an active matrix substrate according to a first embodiment.

[Structure]

Cross-Sectional Structure

With reference to FIG. 1, this embodiment explains a semiconductor device 1A applied to an active matrix substrate according to the first embodiment. FIG. 1 is a cross-sectional view schematically showing an example of the semiconductor device 1A applied to an active matrix substrate according to the first embodiment. In FIG. 1, the horizontal direction parallel to the substrate surface of an insulating substrate 10 is indicated as an X-direction. The direction substantially perpendicular to the X-direction is indicated as a Y-direction. Here, the semiconductor device 1A is explained with an organic electroluminescence (OEL) display device as an example. However, the semiconductor device 1A is not limited to this example as described later.

As shown in FIG. 1, the semiconductor device 1A comprises first and second thin-film transistors TrA and TrB provided on a substrate including the insulating substrate 10.

The substrate comprises the insulating substrate 10, and an underlayer (undercoat layer) 19 which is provided on the insulating substrate 10 and prevents the diffusion of the impurities in the insulating substrate 10.

The insulating substrate 10 includes a pixel area DA, and a peripheral circuit area PA around the pixel area DA. The insulating substrate 10 is formed of an insulating material such as glass or resin.

The underlayer (undercoat layer) 19 includes an underlayer 19A provided in the pixel area DA, and an underlayer 19B provided in the peripheral circuit area PA. The underlayer 19A of the pixel area DA comprises a first insulating layer 11 provided on the insulating substrate 10, and a second insulating layer 12A provided on the first insulating layer 11. The underlayer 193 of the peripheral circuit area PA comprises the first insulating layer 11 provided on the insulating substrate 10, and a second insulating layer 12B provided on the first insulating layer 11.

The first insulating layer 11 is formed of an insulating material including at least nitrogen (N). The first insulating layer 11 is formed of, for example, a silicon nitride ($Si_3N_4$) layer or a silicon oxynitride (SiON) layer. Layer thickness T11 of the first insulating layer 11 is, for example, approximately 200 nm, and is configured to so as to be substantially the same (or uniform) in the pixel area DA and the peripheral circuit area PA.

The second insulating layers 12A and 12B are formed of an insulating material including at least oxygen (O). The second insulating layers 12A and 12B are formed of, for example, a silicon oxide ($SiO_2$) layer. Layer thickness T12A of the second insulating layer 12A in the pixel area DA is, for example, approximately 50 to 100 nm. Layer thickness T12B of the second insulating layer 12B in the peripheral circuit area PA is, for example, approximately 200 nm. Layer thickness T12B of the second insulating layer 12B in the peripheral circuit area PA is configured to so as to be thicker than layer thickness T12A of the second insulating layer 12A in the pixel area DA (T12B>T12A). As a result, layer thickness TB of the underlayer 19B in the peripheral circuit area PA is configured to so as to be thicker than layer thickness TA of the underlayer 19A in the pixel area DA. (TB>TA).

(First and Second Thin-Film Transistors TrA and TrB)

The first and second thin-film transistors TrA and TrB are, for example, n-type top-gate thin-film transistors (TFT). The first thin-film transistor TrA comprises an oxide semiconductor layer 13A provided on the second semiconductor layer 12A. The second thin-film transistor TrB comprises an oxide semiconductor layer 13B provided on the second semiconductor layer 12B.

The oxide semiconductor layers 13A and 13B include a source/drain area, and a channel area provided between the source area and the drain area (not shown). The oxide semiconductor layers 13A and 13B are formed of a transparent amorphous oxide semiconductor (TAOS) such as indium gallium zinc oxide (IGZO). The material forming the oxide semiconductor layers 13A and 13B should include, for example, at least one of indium (In), gallium (Ga) and tin (Sn), and may be, for example, indium gallium oxide (IGO), indium zinc oxide (IZO), zinc tin oxide (ZnSnO) or zinc oxide (ZnO).

As explained later, the oxide semiconductor layer 13A in the pixel area DA has a high carrier density and a low resistance in comparison with the oxide semiconductor layer 13B in the peripheral circuit area PA. Thus, threshold voltage VthA of the first thin-film transistor TrA is configured to so as to be lower than threshold voltage VthB of the second thin-film transistor TrB (VthA<VthB).

A gate insulating layer 14 formed of, for example, a silicon oxide (SiO) layer, is provided on the channel area of each of the oxide semiconductor layers 13A and 13B.

A gate electrode 15 formed of, for example, a metal layer having a layer structure of titanium, aluminum and molybdenum nitride, is provided on each gate insulating layer 14. The gate electrode 15 may be formed of, for example, an alloy of aluminum (Al), copper (Cu) or an alloy thereof.

Interlayer insulating layers 16 and 18 formed of, for example, silicon oxide layers, are provided so as to cover the first and second transistors TrA and TrB. A source/drain contact interconnect 17 is provided on each source/drain area of the oxide semiconductor layers 13A and 13B in the interlayer insulating layers 16 and 18.

Although not shown in the figure, the semiconductor device 1A may further comprise a corresponding substrate, etc., on the interlayer insulating layer 18.

Threshold Voltage

Figure 2:
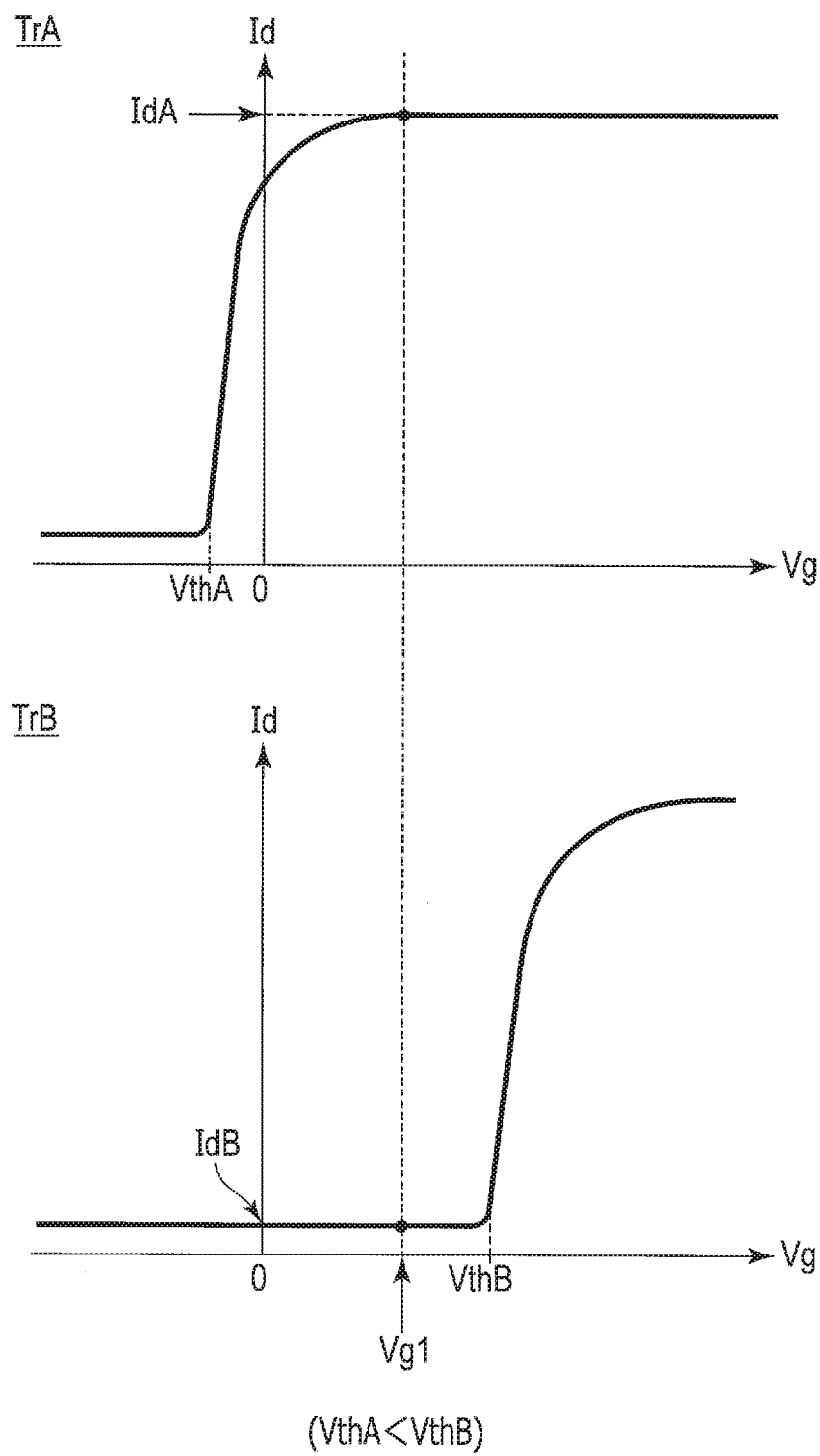
FIG. 2 is shown for explaining the threshold voltage of the first and second thin-film transistors shown in FIG. 1.

Next, this embodiment explains the threshold voltage of the first and second thin-film transistors TrA and TrB having the above structures, referring to FIG. 2. FIG. 2 is shown for explaining the threshold voltage of the first and second thin-film transistors TrA and TrB, and shows the relationship between the gate voltage Vg and the drain current Id in each of the first and second thin-film transistors TrA and TrB.

As shown in FIG. 2, threshold voltage VthA of the first thin-film transistor TrA is configured to so as to be lower than threshold voltage VthB of the second thin-film transistor TrB (VthA<VthB) since, as stated above, the oxide semiconductor layer 13A in the pixel area DA has a high carrier density and a low resistance in comparison with the oxide semiconductor layer 13B in the peripheral circuit area PA.

In the above structure, as shown in, for example, FIG. 2, when gate voltage Vg1 is applied to each gate electrode, gate voltage Vg1 is sufficiently higher than threshold voltage VthA in the first thin-film transistor TrA. Thus, the current path of the first thin-film transistor TrA is in a conductive state. In this way, sufficiently large drain current IdA flows in the channel area of the oxide semiconductor device 13A. In this case, in the second thin-film transistor TrB, gate voltage Vg1 is lower than threshold voltage VthB. Thus, the current path of the second thin-film transistor TrB is in a nonconductive state. In this way, only sufficiently small drain current IdB flows in the channel area of the oxide semiconductor device 13B.

As a result, even when the same gate voltage Vg1 is applied, large drain current IdA is obtained in the pixel area DA, thereby contributing to the improvement of the image quality. Further, a leak current can be diminished by making drain current IdB small in the peripheral area PA. In this way, the electricity consumption can be reduced.

[Manufacturing Method]

Next, this embodiment explains a method for manufacturing the semiconductor device 1A according to the first embodiment, referring to FIG. 3 to FIG. 9.

Figure 3:
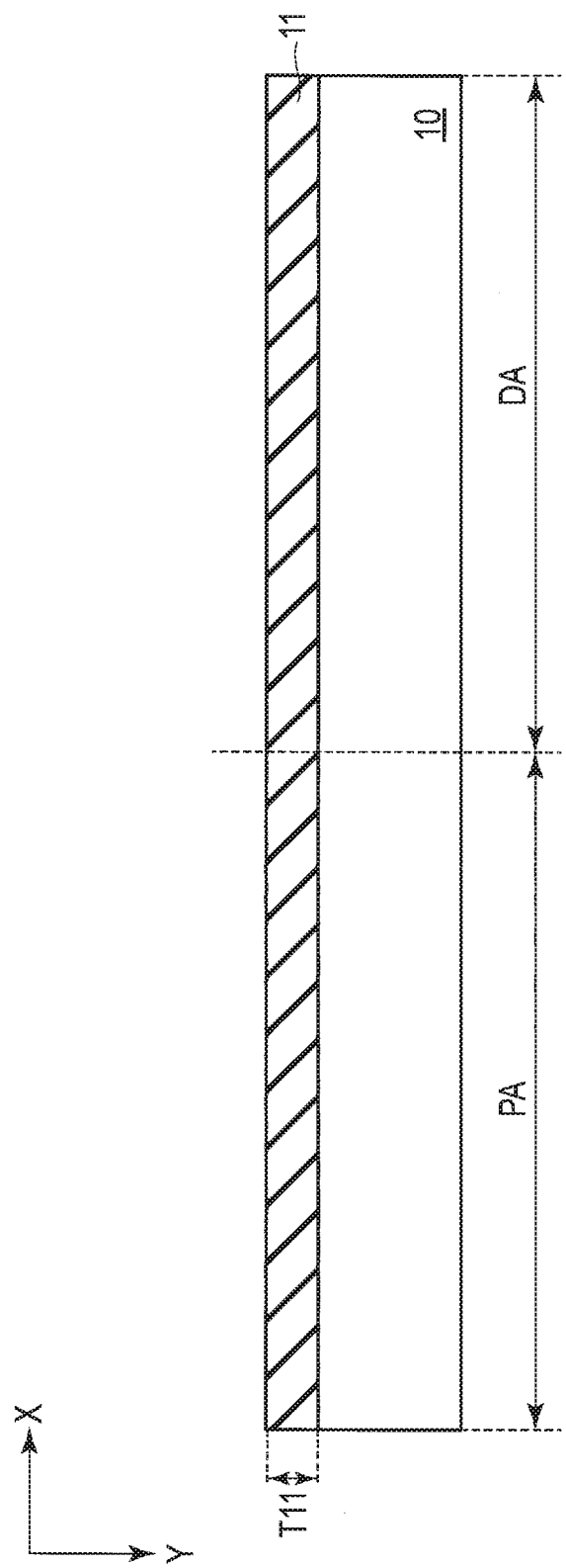
FIG. 3 is a cross-sectional view showing an example of a method for manufacturing the semiconductor device shown in FIG. 1.

As shown in FIG. 3, a silicon nitride layer having a layer thickness i11 of approximately 200 nm is applied onto the insulating substrate 10 in the pixel area DA and the peripheral circuit area PA by, for example, a plasma chemical vapor deposition (plasma CVD) method. In this way, the first insulating layer 11 is formed. The first insulating layer 11 is formed by the above plasma CVD method at approximately 300° C. to 400° C. as the layer-formation temperature, using the plasma generated by a reactant gas including hydrogen (H), such as silane (SiH4) or ammonia (NH3). Thus, the formed first insulating layer 11 includes part of the hydrogen (H) included in the reactive gas.

Subsequently, as shown in FIG. 4, a silicon oxide layer having a layer thickness T12B of approximately 200 nm is applied onto the first insulating layer 11 in the pixel area DA and the peripheral circuit area PA by, for example, a plasma CVD method. In this way, the second insulating layer 12 is formed. Similarly, the second insulating layer 12 is formed by the plasma CVD method, using the plasma generated by a reactant gas including hydrogen (H), such as silane (SiH4) or nitrous oxide (N2O). Similarly, when the second insulating layer 12 is formed, the first insulating layer 11 includes part of the hydrogen (H) included in the reactant gas.

Subsequently, a photoresist 20 is applied onto the entire surface of the second insulating layer 12. The photoresist 20 is patterned such that the surface of the second insulating layer 12A in the pixel area DA is exposed. Subsequently, etching such as dry etching with an RIE method or predetermined wet etching is applied with the patterned photoresist 20 as a mask such that layer thickness T12A of the second insulating layer 12A an the pixel area DA is reduced to, for example, approximately 50 to 100 nm in the Y-direction. As a result, layer thickness T12B of the second insulating layer 123 in the peripheral circuit area PA is formed so as to be thicker than layer thickness T12A of the second insulating layer 12A in the pixel area DA (T12B>T12A).

Subsequently, as shown in FIG. 5, the photoresist 20 in the peripheral circuit area PA is removed. The underlayer 19A comprising the first and second insulating layers 11 and 12A is formed in the pixel area DA. The underlayer 19B comprising the first and second insulating layers 11 and 12B is formed in the peripheral circuit area PA. As a result, layer thickness TB of the underlayer 19B in the peripheral circuit area PA is formed so as to be thicker than layer thickness TA of the underlayer 19A in the pixel area DA (TB>TA).

Figure 6:
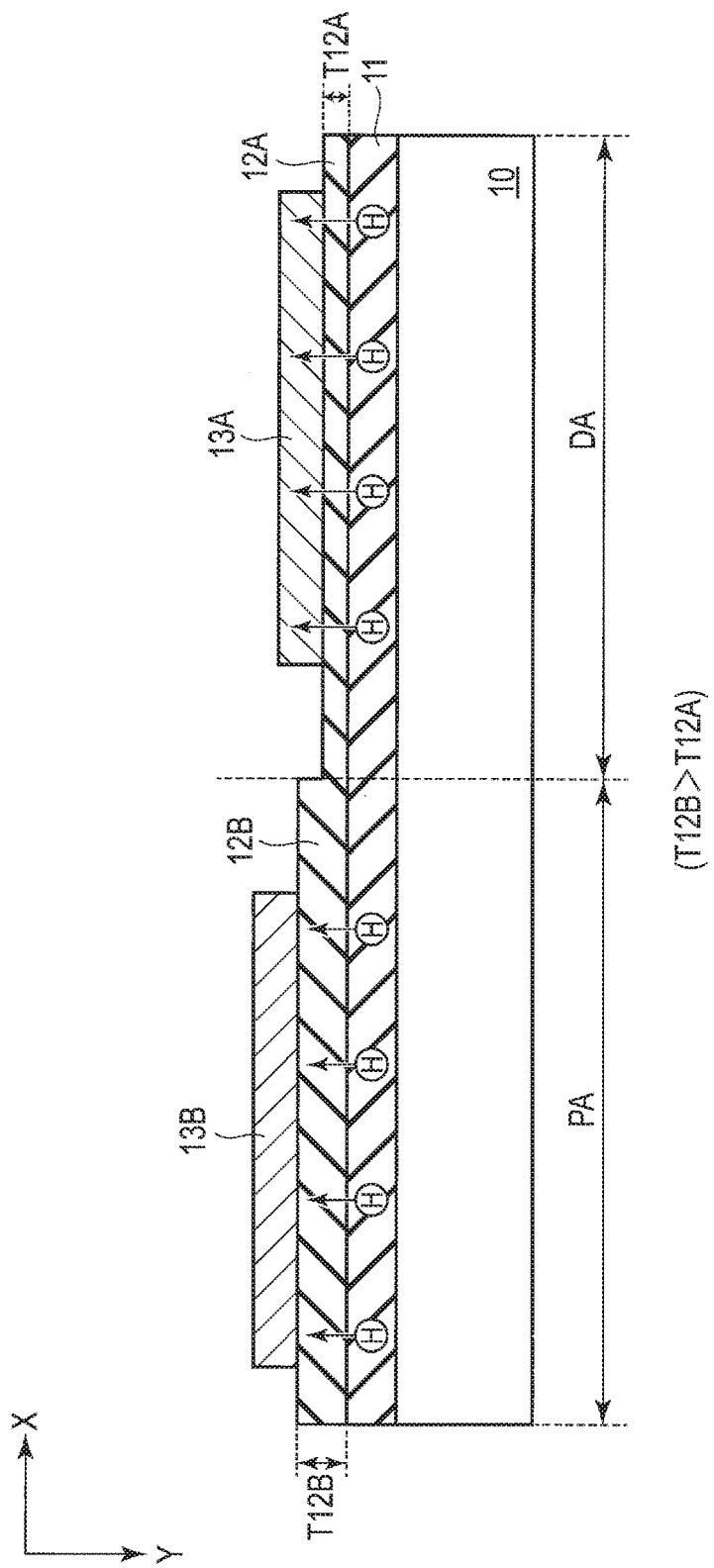
FIG. 6 is a cross-sectional view showing a manufacturing step subsequent to FIG. 5.

Subsequently, as shown in FIG. 6, the oxide semiconductor layers 13A and 13B are formed on the second insulating layers 12A and 12B by, for example, a sputter method, such that the oxide semiconductor layers 13A and 13B include at least one of indium (In), gallium (Ga) and tin (Sn) and are patterned into a predetermined shape.

The temperature of the first insulating layer 11 in this step is approximately 300° C. to 400° C. as the layer-formation temperature of the first insulating layer 11. Therefore, the hydrogen (H) included in the first insulating layer 11 is diffused from the first insulating layer 11 to the surrounding area. Layer thickness T12B of the second insulating layer 12B in the peripheral circuit area PA is thicker than layer thickness T12A of the second insulating layer 12A in the pixel area DA (T12B>T12A). Thus, in the peripheral circuit area PA, the second insulating layer 12B functions as a barrier against the diffused hydrogen and prevents the diffusion of the hydrogen to the oxide semiconductor layer 13B.

In the pixel area DA, the layer thickness of the second insulating layer 12A is thin. Thus, the diffused hydrogen reaches the oxide semiconductor layer 13A. Because of the hydrogen reaching the oxide semiconductor layer 13A, the density of the hydrogen included in the oxide semiconductor layer 13A is increased in comparison with that in the oxide semiconductor layer 13B.

Hydrogen is diffused to the oxide semiconductor layer 13A to control the threshold voltage of the first and second thin-film transistors TrA and TrB. Hydrogen could be diffused to the whole inside of the oxide semiconductor layer 13A as well as the lower surface of the oxide semiconductor layer 13A. The diffusion of hydrogen from the first insulating layer 11 is not limited to the steps for forming the oxide semiconductor layers 13A and 13B. In any step where the temperature of the first insulating layer 11 is approximately 300° C. to 400° C. as the layer-formation temperature, hydrogen could be diffused from the first insulating layer 11. For example, as described later, the threshold voltage of the first and second thin-film transistors TrA and TrB may be controlled by using an anneal process after the formation of the first and second thin-film transistors TrA and TrB.

Subsequently, a silicon oxide layer is formed on the entire surface as a gate insulating layer which covers the oxide semiconductor layers 13A and 13B by, for example, a CVD method. Subsequently, a metal layer is formed on the silicon oxide layer as a gate electrode by, for example, a sputter method. The metal layer is formed by, for example, a stacked layer structure of titanium, aluminum and molybdenum nitride.

Subsequently, as shown in FIG. 7, for example, a predetermined etching process is applied onto the metal layer with a patterned photoresist (not shown) corresponding to substantially the center of each of the oxide semiconductor layers 13A and 13B as a mask. In this way, each gate electrode 15 is formed. Subsequently, the silicon oxide layer is etched by predetermined dry etching, etc. In this way, each gate insulating layer 14 is formed. At the time of this etching step, the oxide semiconductor layers 13A and 13B are overetched in areas where neither the gate electrode 15 nor the gate insulating layer 14 is formed. In each overetched area of the oxide semiconductor layers 13A and 13B, a source/drain area is formed. In the source/drain area, an oxygen defect is generated, and the carrier density of the n-channel MOS transistor is high, and the resistance is low. In each area of the oxide semiconductor layers 13A and 13B where overetching is not applied, in other words, in each area covered by the gate insulating layer 14, a channel area is formed. The carrier density in each channel area is lower than that of each source/drain area. The carrier density of each channel area in the oxide semiconductor layers 13A and 13B is controlled on the basis of the aforementioned density of hydrogen. The carrier density of the oxide semiconductor layer 13A is increased in comparison with that of the oxide semiconductor layer 13B.

Subsequently, as shown in FIG. 8, a silicon oxide layer is formed on the entire surface so as to cover each gate electrode 15 by, for example, a CVP method. In this way, the interlayer insulating layer 16 is formed. Subsequently, each contact hole 161 is formed in the interlayer insulating layer 16 by, for example, an RIE method, so as to reach a corresponding source/drain area of the oxide semiconductor layers 13A and 13B.

Figure 9:
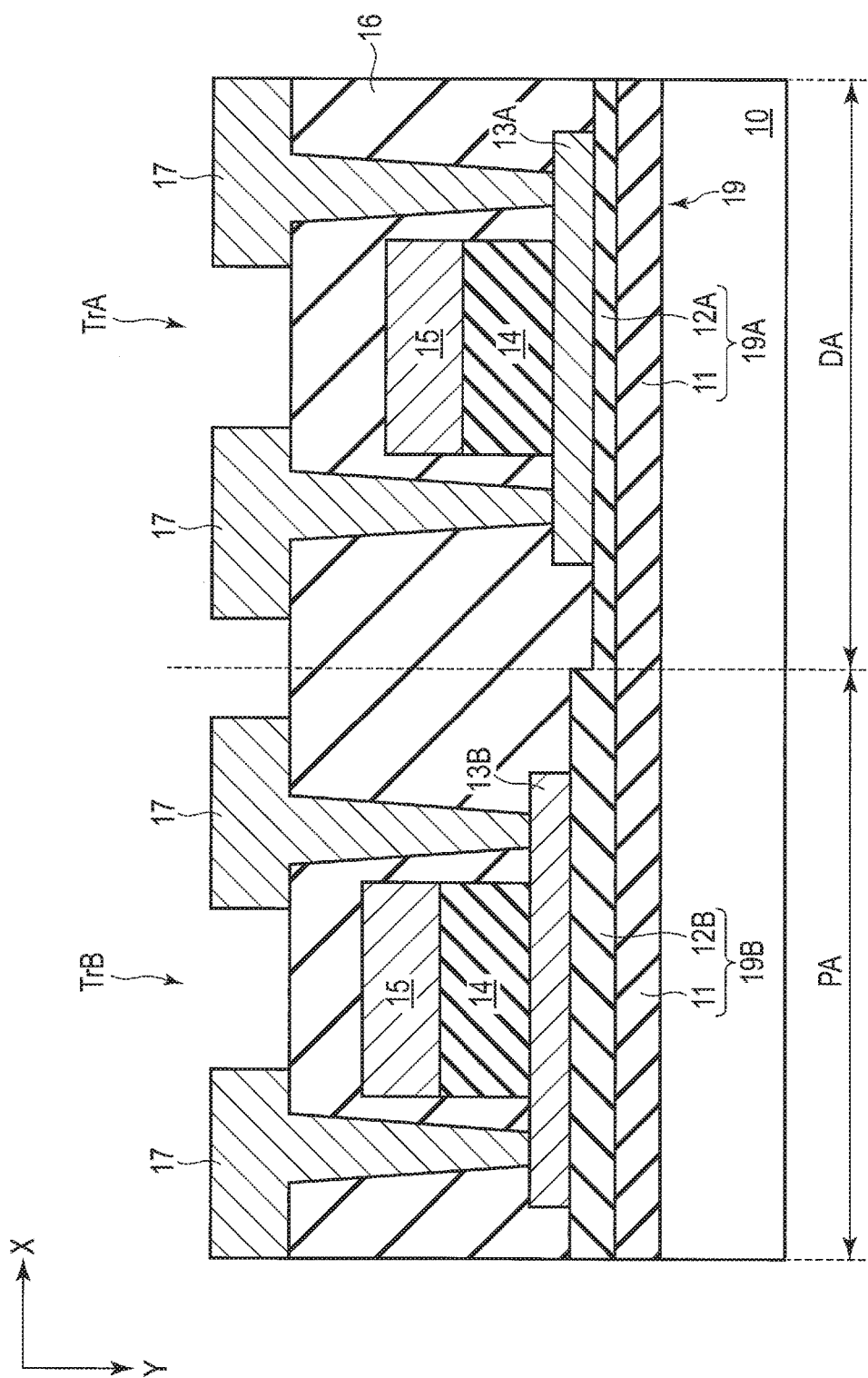
FIG. 9 is a cross-sectional view showing a manufacturing step subsequent to FIG. 8.

Subsequently, as shown in FIG. 9, a metal layer having a stacked structure of titanium, aluminum and molybdenum nitride, etc., is buried into each contact hole 161 by, for example, a sputter method. In this way, the contact interconnects 17 of the source/drain areas are formed. Subsequently, a silicon oxide layer is formed on the entire surface by, for example, the same step. Thus, the interlayer insulating layer 18 (not shown) is formed.

By the above method, the semiconductor device 1A comprising the first and second thin-film transistors TrA and TrB shown in FIG. 1 is manufactured.

[Effects]

As explained above, in the first embodiment, layer thickness T12B of the second insulating layer 12B in the peripheral circuit area PA is configured to so as to be thicker than layer thickness T12A of the second insulating layer 12A in the pixel area DA (T12B>112A). As a result, layer thickness TB of the underlayer 19B in the peripheral circuit area PA is configured to so as to be thicker than layer thickness TA in the underlayer 19A of the pixel area DA (TR>TA).

In the above structure, when the oxide semiconductor layers 13 are formed as shown in FIG. 6 the second insulating layer 12B in the peripheral circuit area PA functions as a barrier against the hydrogen diffused from the first insulating layer 11 and prevents the diffusion of the hydrogen to the oxide semiconductor layer 13B. In the pixel area DA, the layer thickness of the second insulating layer 12A is thin. Thus, the hydrogen diffused from the first insulating layer 11 reaches the oxide semiconductor layer 13A. Because of the hydrogen reaching the oxide semiconductor layer 13A, the carrier density of the oxide semiconductor layer 13A is increased, and thus, the resistance of the oxide semiconductor layer 13A is further decreased.

In this way, threshold voltages VthA and VthB of the first and second thin-film transistors TrA and TrB adjacent to each other in the pixel area DA and the peripheral circuit area PA can be configured to so as to be different from each other. For example, threshold voltage VthA of the first thin-film transistor TrA is configured to so as to be lower than threshold voltage VthB of the second thin-film transistor TrB (VthA<VthB).

The above structure contributes to the improvement of the image quality by obtaining large drain current IdA in the pixel area DA even when the same gate voltage Vg1 is applied as shown in, for example, FIG. 2. In the peripheral circuit area PA, small drain current IdB allows the reduction in the leak current. Thus, the electricity consumption can be reduced.

Threshold voltage VthA can be configured to so as to be different from threshold voltage VthB by merely controlling the reduction in layer thickness T12A of the second insulating, layer 12A in the pixel area DA, for example, by adjusting the etching time, in the etching process shown in FIG. 4. For example, when layer thickness T12A is reduced to approximately 50 nm by controlling the etching time so as to be longer, threshold voltage VthA can be further decreased. Thus, the manufacturing cost can be also reduced.

Modification Example 1

Figure 10:
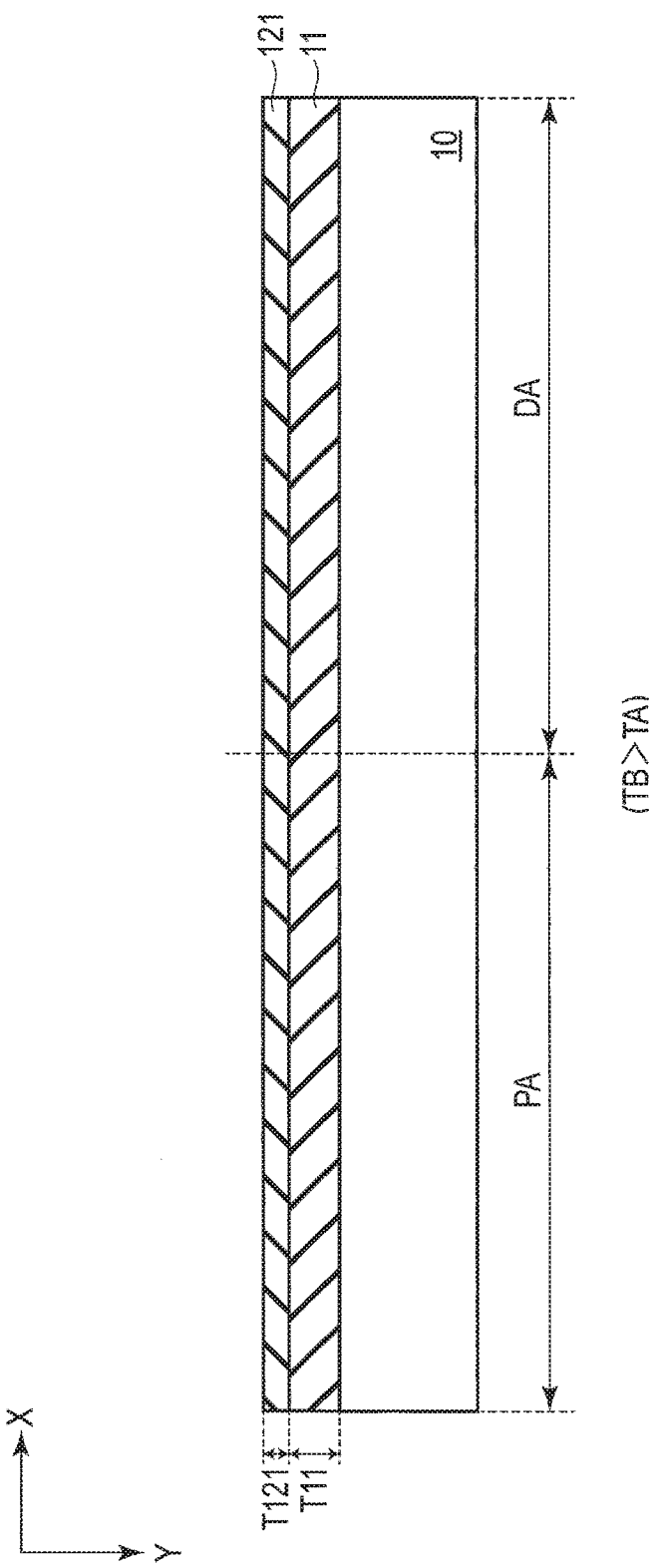
FIG. 10 is a cross-sectional view showing an example of the method for manufacturing the semiconductor device applied to an active matrix substrate according to modification example 1.
Figure 11:
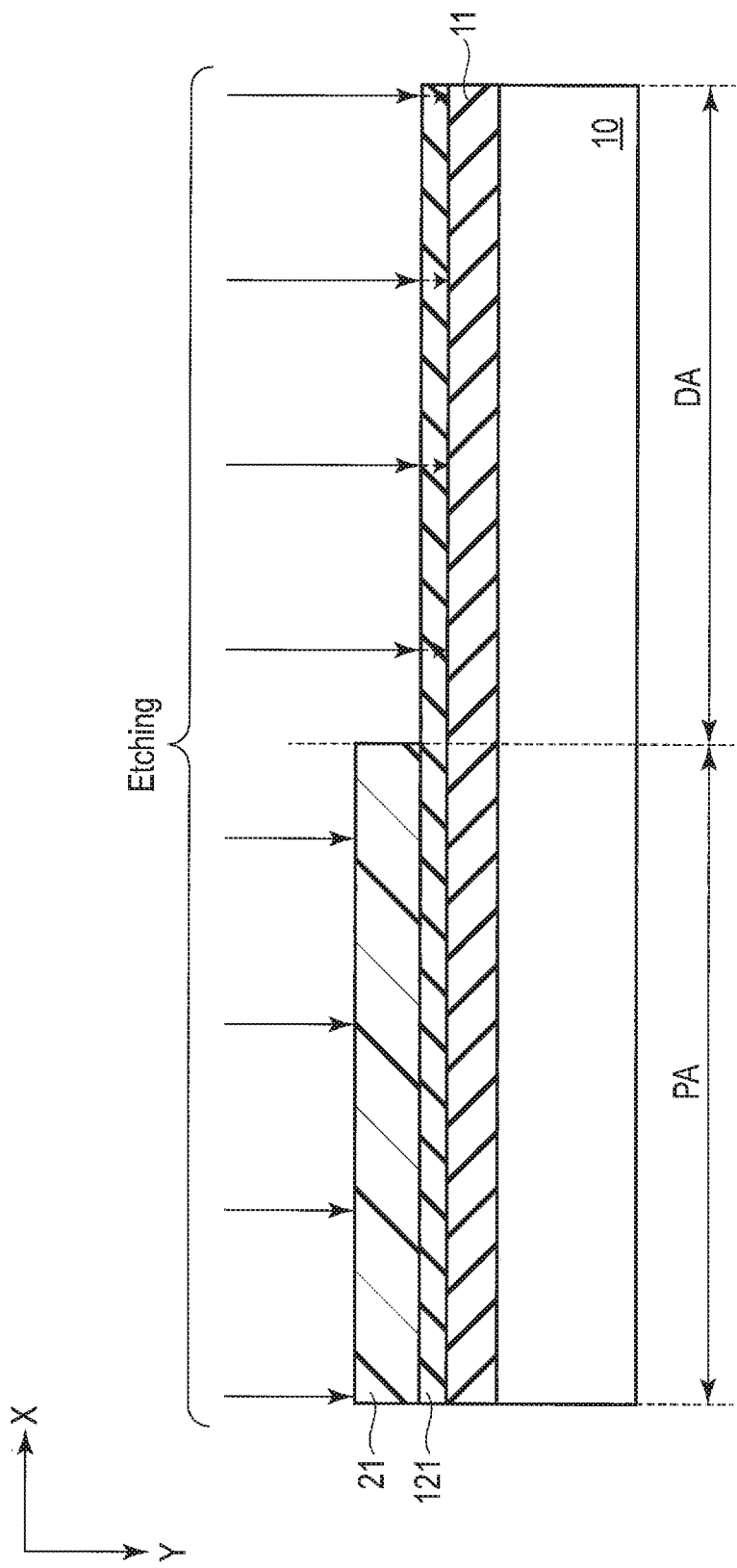
FIG. 11 is a cross-sectional view showing a manufacturing step subsequent to FIG. 10.
Figure 12:
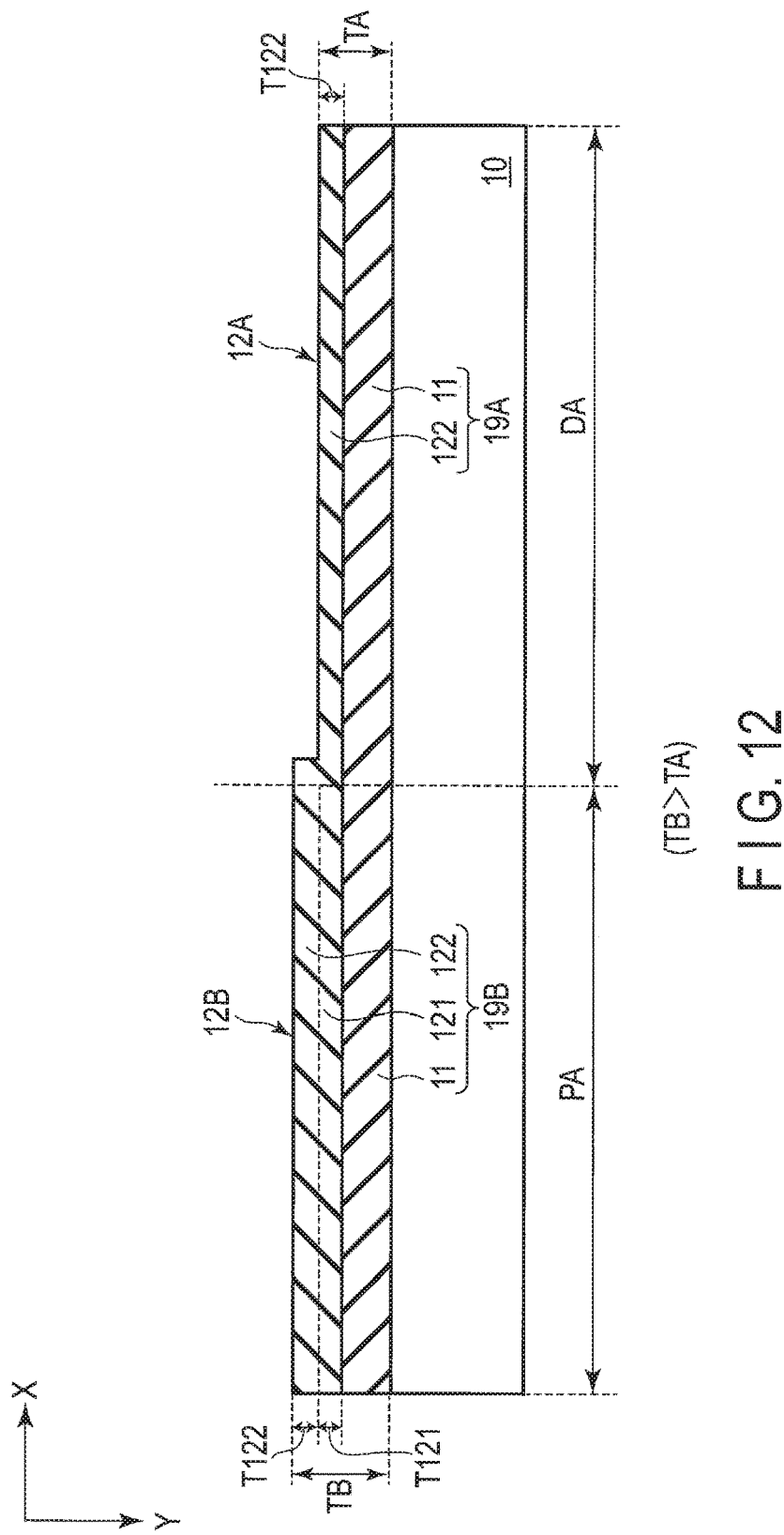
FIG. 12 is a cross-sectional view showing a manufacturing step subsequent to FIG. 11.

Next, this modification example 1 explains another method for manufacturing the semiconductor device 1A according to the first embodiment, referring to FIG. 10 to FIG. 12. The structure is substantially the same as that of the first embodiment. Thus, the detailed description thereof is omitted.

[Manufacturing Method]

As shown in FIG. 10, a silicon nitride layer having a layer thickness T11 of approximately 200 nm is applied onto the insulating substrate 10 in the pixel area DA and the peripheral circuit area PA by, for example, a plasma CVD method. In this way, the first insulating layer 11 is formed.

Subsequently, a silicon oxide layer having a layer thickness T121 of approximately 100 nm is applied onto the first insulating layer 11 in the pixel area DA and the peripheral circuit area PA by, for example, a plasma CVD method. In this way, an insulating layer 121 is formed.

Subsequently, as shown in FIG. 11, a photoresist 21 is applied onto the entire surface, and is patterned such that the surface of the insulating layer 121 of the pixel area GA is exposed. Subsequently, etching is applied in the Y-direction to the extent of the surface of the first insulating layer 11 with the patterned photoresist 21 as a mask by, for example, an RIE method. Thus, the insulating layer 121 of the pixel area DA is removed.

Subsequently, as shown in FIG. 12, the photoresist 21 of the peripheral circuit area PA is removed. A silicon oxide layer having a layer thickness T122 of approximately 100 nm is applied onto the entire surface in the pixel area DA and the peripheral circuit area PA by, for example, a plasma CVD method. In this way, an insulating layer 122 is formed.

As a result, the underlayer 19A comprising the first insulating layer 11 and the second insulating layer 122 (12A) is formed in the pixel area D. In the peripheral circuit area PA, the underlayer 19B comprising the first insulating layer 11 and the second insulating layers 121 and 122 (12B) is formed. Thus, layer thickness TB of the underlayer 191 of the peripheral circuit area PA is formed so as to be thicker than layer thickness TA of the underlayer 19A of the pixel area DA (TB>TA).

Subsequently, the same manufacturing method as that of the first embodiment is used in this manner, the semiconductor device 1 is manufactured.

[Effects]

Effects similar to those of the first embodiment can be obtained by the structure of modification example 1 and its manufacturing method. Furthermore, in modification example 1, the insulating layer 122 is formed on the entire surface in the pixel area DA and the peripheral circuit area PA after the insulating layer 121 of the pixel area DA is removed (FIG. 11 and FIG. 12). Thus, the difference in the layer thickness between the pixel area DA and the peripheral circuit area. PA can be further assured (TB>TA) by removing the insulating layer 121 of the pixel area DA and forming the second insulating layers 121 and 122. In this way, threshold voltage VthA can be further certainly configured to so as to be different from threshold voltage VthB (VthB>VthA).

Modification Example 2 [Example in Which the Underlayer in the Pixel Area Does Not Comprise the Second Insulating Layer]

Figure 13:
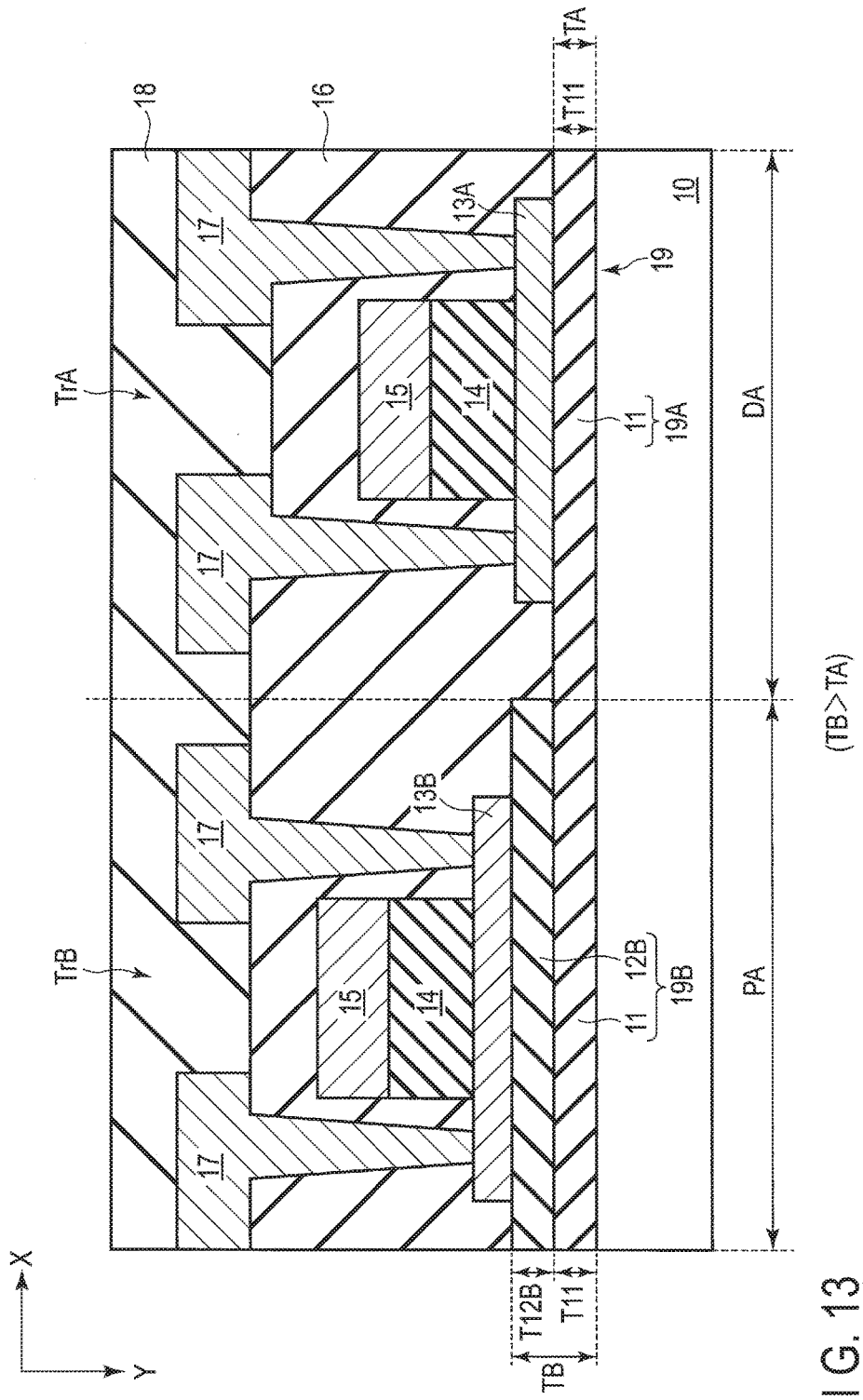
FIG. 13 is a cross-sectional view schematically showing an example of the semiconductor device applied to an active matrix substrate according to modification example 2.

This example explains a semiconductor device 1B according to modification example 2 of the first embodiment with reference to FIG. 13. The semiconductor device 1B of modification example 2 relates to an example in which the underlayer 19A in the pixel area DA does not comprise the second insulating layer 12. FIG. 13 is a cross-sectional view schematically showing an example of the semiconductor device 15 applied to an active matrix substrate according to modification example 2.

[Structure]

As shown in FIG. 13, in the semiconductor device 1E of modification example 2, the underlayer 19A in the pixel area DA does not comprise the second insulating layer 12A and comprises only the first insulating layer 11, in comparison with the first embodiment and modification example 1. In other words, the layer thickness of the second insulating layer 12A of the underlayer 19A in the pixel area DA of modification example 2 is substantially zero.

The other structures are substantially the same as those of the first embodiment and modification example 1. Thus, the detailed description thereof is omitted.

[Manufacturing Method]

The manufacturing method differs from that of the first embodiment in the following respect. For example, the etching time is longer than that of the first embodiment in the etching process shown in FIG. 4. The second insulating layer 12A of the pixel area DA is etched to the extent that the surface of the first insulating layer 11 is exposed. In other words, in the etching process, etching is applied until layer thickness T12A of the second insulating layer 12A becomes substantially zero.

The other structures are substantially the same as those of the first embodiment and modification example 1. Thus, the detailed description thereof is omitted.

[Effects]

In the semiconductor device 1B of modification example 2, the underlayer 19A in the pixel area DA does not comprise the second insulating layer 12A and comprises only the first insulating layer 11.

Thus, the underlayer 19A of the pixel area DA does not comprise the second insulating layer 12 which functions as a barrier against the hydrogen diffused from the first insulating layer 11. Thus, the hydrogen diffused from the first insulating layer 11 is directly diffused to the oxide semiconductor layer 13A. As a result, the carrier density of the oxide semiconductor layer 13A of modification example 2 is further increased in comparison with the first embodiment and modification example 1. Thus, the resistance of the oxide semiconductor layer 13A of modification example 2 is further decreased in comparison with the first embodiment and modification example 1. In modification example 2, it is possible to further directly and certainly configured to the difference between threshold voltage VthA and threshold voltage VthB (VthE>VthA).

Furthermore, the second insulating layer in the pixel area GA is entirely removed. Thus, there is no need to maintain the thin second insulating layer 12A in comparison with the first embodiment. Thus, the manufacturing method can be simplified in comparison with the first embodiment.

Second Embodiment [Example in Which the Layer Thickness of a First Insulating Layer as a Source of Hydrogen (H) is Controlled]

With reference to FIG. 14 to FIG. 17, this embodiment explains the structure of a semiconductor device 1C and a method for manufacturing the semiconductor device 1C. The second embodiment relates to an example in which the layer thickness of a first insulating layer 11 as a source of hydrogen (H) is controlled. With respect to the explanation of the second embodiment, the detailed description of portions substantially overlapping the first embodiment is omitted.

[Structure]

In the first embodiment, layer thickness T11 of the first insulating layer 11 as a source of hydrogen is the same (uniform) in the pixel area DA and the peripheral circuit area PA while the layer thickness of the second insulating layer 12 as a barrier layer which prevents the diffusion of hydrogen differs between the pixel area DA and the peripheral circuit area PA.

Figure 14:
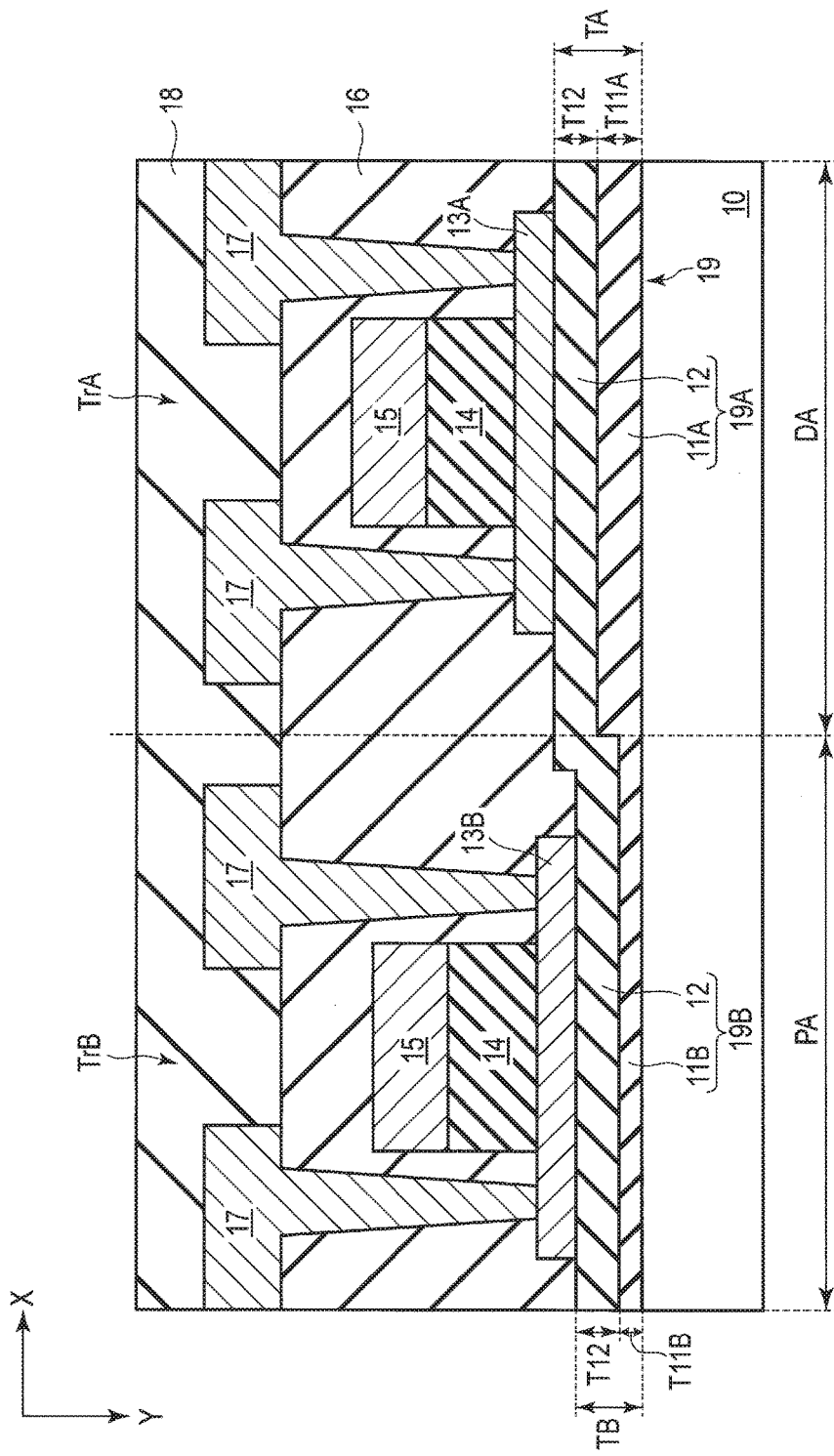
FIG. 14 is a cross-sectional view showing a semiconductor device applied to an active matrix substrate according to a second embodiment.

In the second embodiment shown in FIG. 14, layer thickness T11A of a first insulating layer 11A in a pixel area DA is configured to so as to be thicker than layer thickness T11B of a first insulating layer 11B of a peripheral circuit area PA (T11A>T11B). Layer thickness T12 of a second insulating layer 12 is substantially the same and uniform in the pixel area DA and the peripheral circuit area PA. As a result, in the second embodiment, layer thickness TB of an underlayer 19B in the peripheral circuit area PA is configured to so as to be thinner than layer thickness TA of an underlayer 19A in the pixel area DA (TB<TA).

When the underlayers 19A and 19B have the above structures, the amount of hydrogen (H) generated from the first insulating layer 11A in the pixel area DA is thicker than that generated from the first insulating layer 11B in the peripheral circuit area PA. Layer thickness T12 of the second insulating layer 12 as a barrier layer which prevents the diffusion of hydrogen (H) is constant in the pixel area DA and the peripheral circuit area PA.

Thus, an oxide semiconductor layer 13A provided in the pixel area DA has a high carrier density and a low resistance in comparison with an oxide semiconductor layer 13B provided in the peripheral circuit area PA. As a result, similarly, threshold voltage VthA of a first thin-film transistor TrA is configured to so as to be lower than threshold voltage VthB of a second thin-film transistor TrB (VthA<VthB).

The other structures are substantially the same as those of the first embodiment. Thus, the detailed description thereof is omitted.

[Manufacturing Method]

Figure 16:
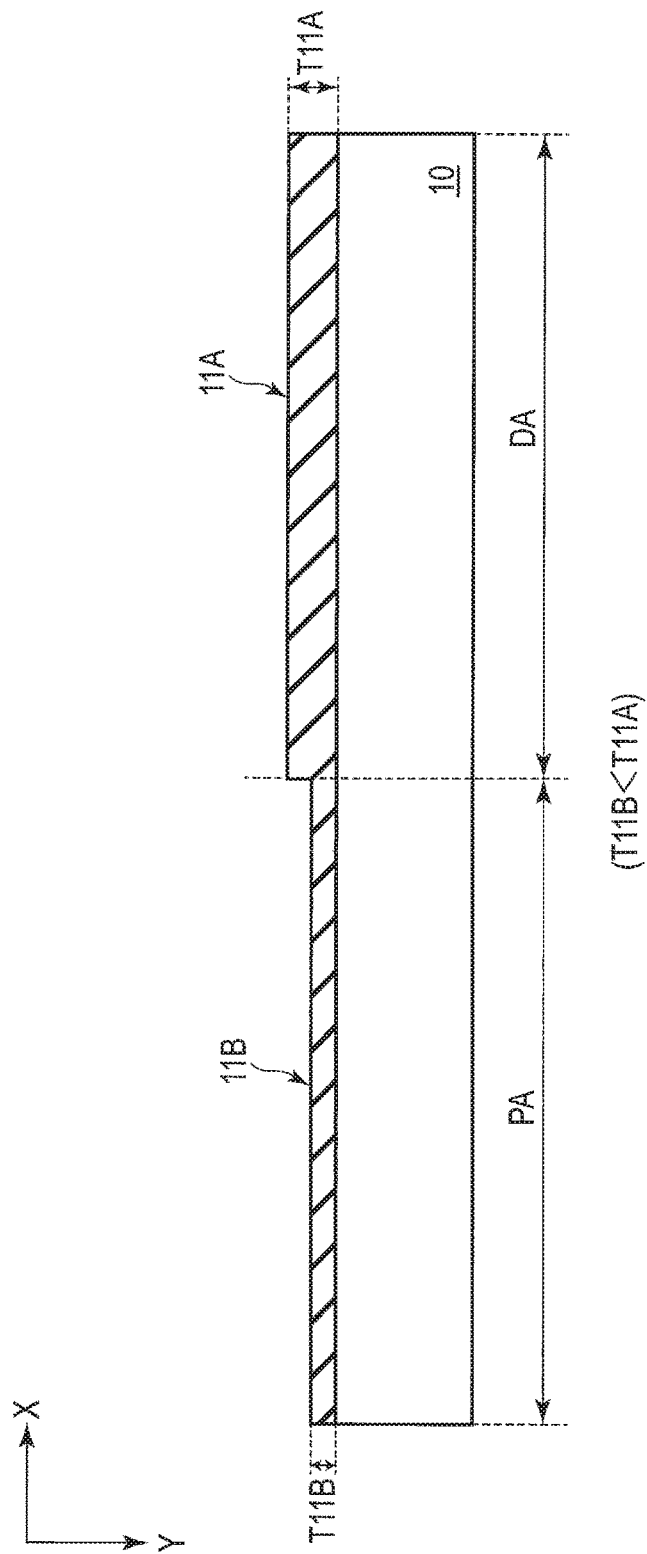
FIG. 16 is a cross-sectional view showing manufacturing step subsequent, to FIG. 15.

Next, this embodiment explains a method for manufacturing the semiconductor device 1C with reference to FIG. 15 to FIG. 17.

As shown in FIG. 15, a silicon nitride (SiN) layer having a layer thickness T11A of approximately 200 nm is applied onto an insulating substrate 10 in the pixel area DA and the peripheral circuit area PA by, for example, a plasma CVD method. In this way, the first insulating layer 11 is formed. The first insulating layer 11 is formed at approximately 300° C. to 400° C. as the layer-formation temperature, using hydrogen (H) as the reactant gas of the plasma CVD method. Thus, the formed first insulating layer 11 includes the hydrogen (H).

Subsequently, a photoresist 22 is applied onto the entire surface. The photoresist 22 is patterned such that the surface of the first insulating layer 11 in the peripheral circuit area PA is exposed. Subsequently, etching is applied with the patterned photoresist 22 as a mask by, for example, an RIE method. The etching time is controlled such that layer thickness TUB of the first insulating layer 11 in the peripheral circuit area PA is reduced to, for example, approximately 100 nm in the Y-direction.

Subsequently, as shown in FIG. 16, the photoresist 22 is removed. As a result, layer thickness T11B of the first insulating layer 11B in the peripheral circuit area PA is formed so as to be thinner than layer thickness T11A of the first insulating layer 11A in the pixel area DA (T11B<T11A).

Subsequently, as shown in FIG. 17, similarly, a silicon oxide layer having a layer thickness T12 of approximately 200 nm is applied onto the first insulating layers 11A and 11B in the pixel area IDA and the peripheral area PA by, for example, a plasma CVD method. In this way, the second insulating layer 12 is formed. As a result, the underlayer 19A comprising the first and second insulating layers 11A and 12 is formed in the pixel area DA. The underlayer 19B comprising the first and second insulating layers 11B and 12 is formed in the peripheral circuit area PA. Thus, layer thickness TB of the underlayer 19B in the peripheral circuit area PA is formed so as to be thinner than layer thickness TA of the underlayer 19A of the pixel area DA (TB<TA).

Subsequently, the same manufacturing method as the above description is used. In this manner, the semiconductor device 1C of the second embodiment is manufactured.

[Effects]

Effects similar to those of the first embodiment can be obtained from the structure and the manufacturing method according to the second embodiment. Further, the second embodiment can be applied where necessary.

Third Embodiment

Third embodiment explains a semiconductor device 1D applied to an active matrix substrate with reference to FIG. 18 to FIG. 26.

[Structure]

Cross-Sectional Structure

Figure 18:
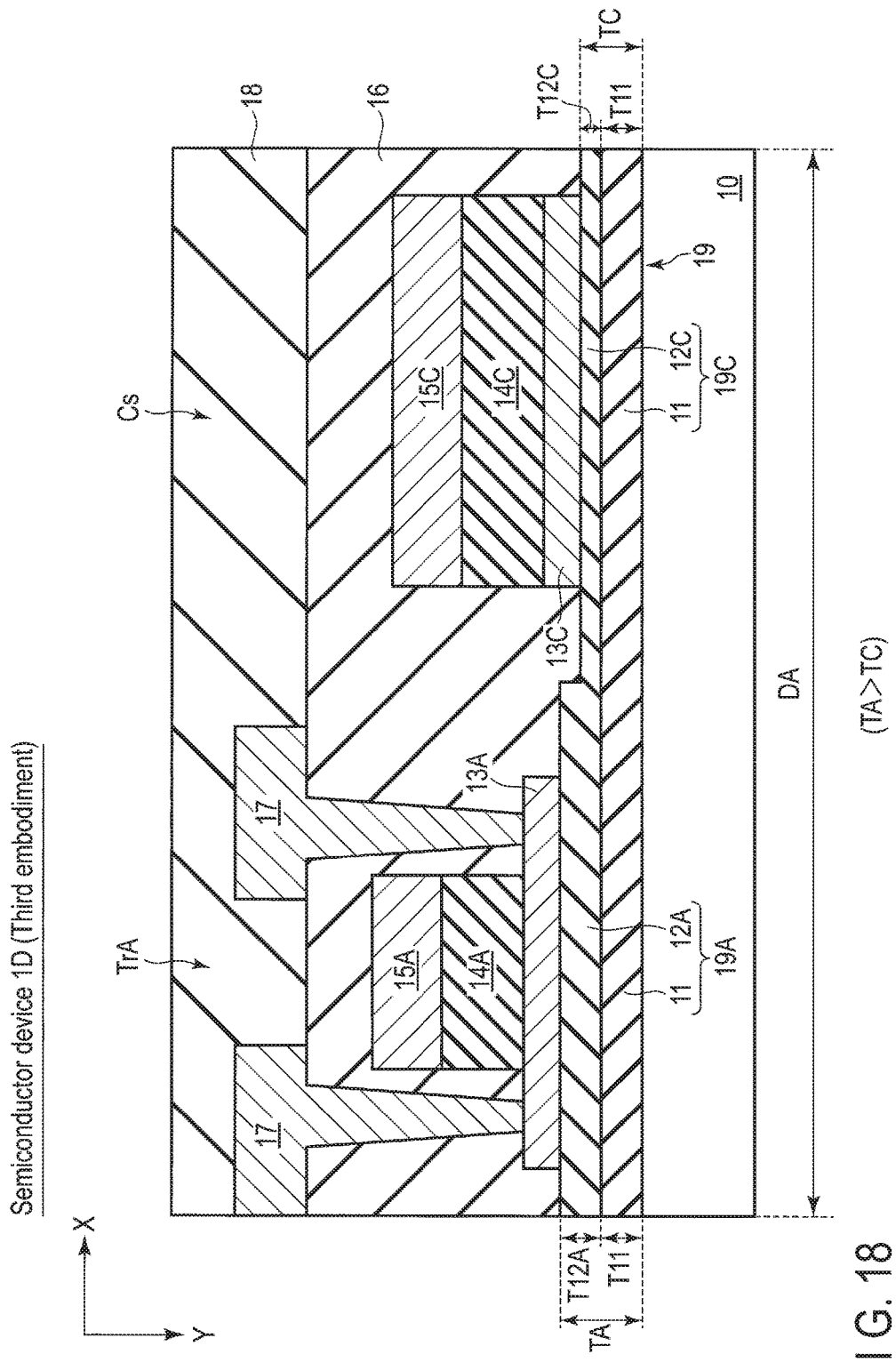
FIG. 18 is a cross-sectional view schematically showing an example of a semiconductor device applied to an active matrix substrate according to a third embodiment.

This explains a semiconductor device 1D applied to an active matrix substrate with reference to FIG. 18. FIG. 18 is a cross-sectional view schematically snowing an example of the semiconductor device 1D applied to an active matrix substrate according to the third embodiment. In FIG. 18, the horizontal direction parallel to the substrate surface of an insulating substrate 10 is indicated as an X-direction, and the direction substantially perpendicular to the X-direction is indicated as a Y-direction. Here, the semiconductor device 1D is explained with an organic electroluminescence (OEL) display device as an example. However, the semiconductor device 1D is not limited to this example as described later.

As shown in FIG. 18, the semiconductor device 1D comprises a thin-film transistor TrA and a capacitor Cs on a substrate including the insulating substrate 10.

The substrate comprises the insulating substrate 10, and an underlayer (undercoat layer) 19 which is provided on the insulating substrate 10 and prevents the diffusion of the impurities of the insulating substrate 10.

The insulating substrate 10 includes a pixel area DA, and is formed of an insulating material such as glass or resin. The insulating substrate 10 may include a peripheral circuit area PA around the pixel area DA.

The underlayer (undercoat layer) 19 includes an underlayer 19A provided in the thin-film transistor TrA in the pixel area DA, and an underlayer 19C provided in the capacitor Cs in the pixel area DA. The underlayer 19A of the thin-film transistor TrA comprises a first insulating layer 11 provided on the insulating substrate 10, and a second insulating layer 12A provided on the first insulating layer 11. The underlayer 19C of the capacitor Cs comprises the first insulating layer 11 provided on the insulating substrate 10, and a second insulating layer 12C provided on the first insulating layer 11.

The first insulating layer 11 is formed of an insulating material including at least nitrogen (N). The first insulating layer 11 is formed of, for example, a silicon nitride ($Si_3N_4$) layer or a silicon oxynitride (SiON) layer. Layer thickness T11 of the first insulating layer 11 is, for example, approximately 200 nm, and is configured to so as to be substantially the same (or uniform) in the pixel area DA.

The second insulating layers 12A and 12C are formed of, for example, a silicon oxide ($SiO_2$) layer. Layer thickness T12A of the second insulating layer 12A is approximately 200 nm. Layer thickness T12C of the second insulating layer 12C is, for example, approximately 50 nm to 100 nm. Thus, layer thickness T12A of the second insulating layer 12A of the thin-layer transistor TrA is configured to so as to be thicker than layer thickness T12C of the second insulating layer 12C of the capacitor Cs (T12A>T12C). As a result, layer thickness TA of the underlayer 19A of the thin-film transistor TrA is configured to so as to be thicker than layer thickness TC of the underlayer 19C of the capacitor Cs (TA>TC). As described later, an oxide semiconductor layer 13C as the bottom electrode of the capacitor Cs is preferably a conductor. Thus, the second insulating layer 12A should be at least provided between the first insulating layer 11 and the oxide semiconductor layer 13A.

(Thin-Film Transistor TrA and Capacitor Cs)

The thin-film transistor TrA is, for example, an n-type top-gate thin-film transistor (TFT). The thin-film transistor TrA and the capacitor Cs comprise oxide semiconductor layers 13A and 13C provided on the second semiconductor layers 12A and 12C. The oxide semiconductor layer 13A of the thin-film transistor TrA includes a source/drain area and a channel area provided between the source area and the drain area (not shown). The oxide semiconductor layer 13C of the capacitor Cs functions as one of the electrodes of the capacitor Cs (in other words, as the bottom electrode).

The oxide semiconductor layers 13A and 13C are formed of a transparent amorphous oxide semiconductor (TAOS) such as indium gallium zinc oxide (IGZO). The material forming the oxide semiconductor layers 13A and 13C should include, for example, at least one of indium (In), gallium (Ga) and tin (Sn), and may be, for example, indium gallium oxide (IGO), indium zinc oxide (IZO), zinc tin oxide (Zn-SnO) or zinc oxide (ZnO).

As explained later, the oxide semiconductor layer 13C of the capacitor has a low resistance in comparison with the oxide semiconductor layer 13A of the thin-film transistor TrA, and is substantially made conductive. Thus, electrical resistance CR of the oxide semiconductor layer 13C of the capacitor Cs is configured to so as to be lower than electrical resistance AR of the oxide semiconductor layer 13A of the thin-film transistor TrA (CR<AR).

A gate insulating layer 14A formed of, for example, a silicon oxide (SiO) layer, is provided on the channel area of the oxide semiconductor layer 13A.

A gate electrode 15A is provided on the gate insulating layer 14A. The gate electrode 15A is formed of, for example, a metal layer having a stacked structure of titanium, aluminum and molybdenum nitride.

A capacitor insulating layer 14C formed of, for example, a silicon oxide (SiO) layer, is provided on the oxide semiconductor layer 13C.

The other electrode (top electrode) 15C of the capacitor Cs is provided on the capacitor insulating layer 140. The electrode 150 is formed of, for example, a metal layer having a stacked structure of titanium, aluminum and molybdenum nitride. The gate electrode 15A and the other electrode 150 of the capacitor Cs may be formed of, for example, an alloy of aluminum (Al), copper (Cu) or an alloy thereof.

Interlayer insulating layers 16 and 18 formed of, for example, silicon oxide layers, are provided so as to cover the first transistor TrA and the capacitor Cs. A source/drain contact interconnect 17 is provided on the source/drain area of the oxide semiconductor layer 13A in the interlayer insulating layers 16 and 18 of the first transistor TrA.

Although not shown in the figure, the semiconductor device 1D may further comprise a corresponding substrate, etc., on the interlayer insulating layer 18.

Voltage Dependence of Capacitance of Capacitor

Figure 19:
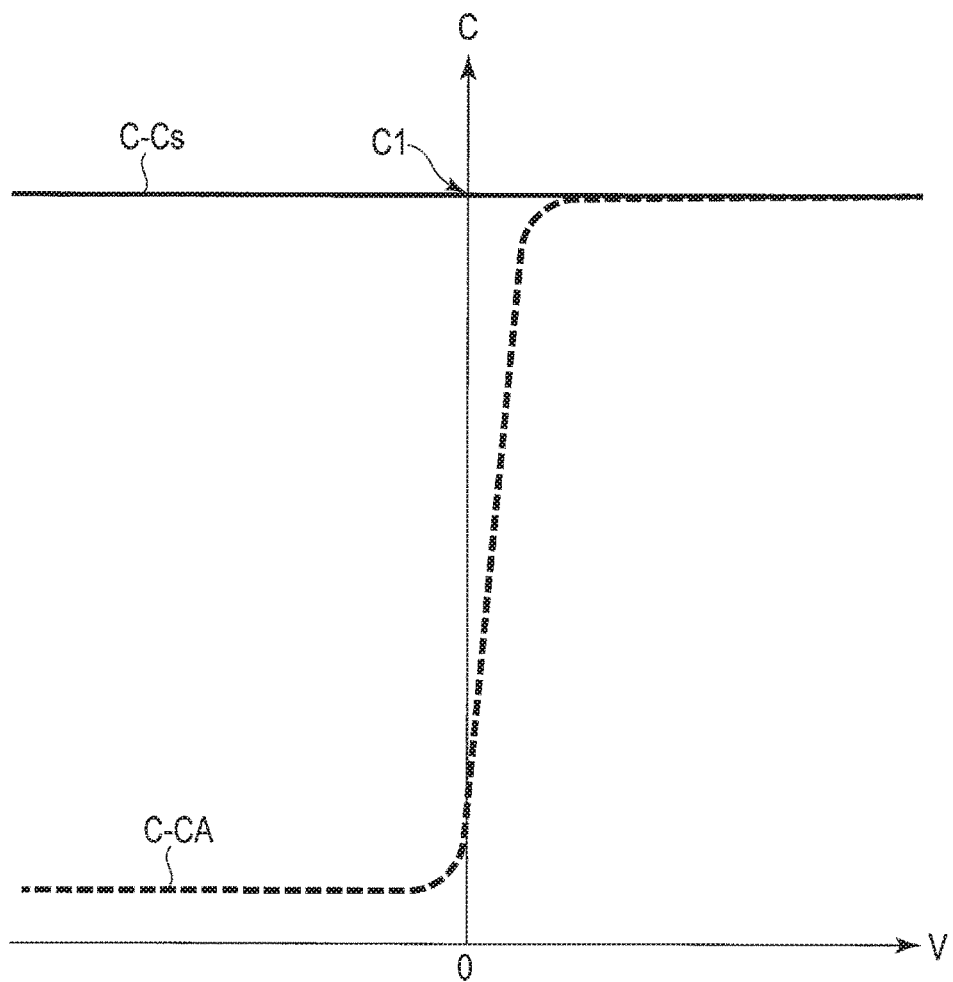
FIG. 19 is shown for explaining the relationship between the voltage and the capacitance in the capacitor shown in FIG. 18.

Next, this embodiment explains the voltage dependence of the capacitance of the capacitor Cs having the above structure, referring to FIG. 19. FIG. 19 is shown for explaining the voltage dependence of the capacitance of the capacitor Cs, and shows the relationship between the voltage V applied to the capacitor and capacitance C. In FIG. 19, the solid line C-Cs represents the voltage dependence of the capacitance of the capacitor Cs in the present embodiment. The dashed line C-CA represents the voltage dependence of the capacitance of a capacitor CA in a comparative example. In the capacitor CA of the comparative example, an oxide semiconductor (for example, the oxide semiconductor layer 13A) which is not made conductive (in other words, an oxide semiconductor whose resistance is not made low) is used as one of the electrodes.

As shown in FIG. 19, property C-Cs of the capacitor Cs of the present embodiment shows that high capacitance C1 is maintained substantially constant regardless of the voltage V applied to the capacitor Cs. Thus, property C-Cs shows that capacitance C substantially does not depend on voltage or does not change.

In property C-CA of the capacitor CA of the comparative example, the capacitance rapidly increases to capacitance C1 when the voltage V changes from a negative to a positive based on zero. Since property C-CA has the above voltage dependence of capacitance C, capacitance C dramatically changes based on the applied voltage V. When the capacitor CA of the comparative example having the voltage dependence is applied to the capacitance element included in a pixel, the available capacitance is unstable because of the change in the capacitance. Thus, the image quality of the pixel area may be degraded.

On the other hand, property C-Cs of the capacitor Cs of the present embodiment shows that high capacitance C1 is maintained substantially constant regardless of the voltage V applied to the capacitor Cs. Thus, capacitance C substantially does not depend on voltage or does not change. Thus, when the capacitor Cs of the present embodiment is applied to the capacitance element included in a pixel, the capacitance substantially does not depend on the applied voltage, and is stable. Thus, the image quality of the pixel area can be improved.

[Manufacturing Method]

Next, this embodiment explains a method for manufacturing the semiconductor device 1D, referring to FIG. 20 to FIG. 26.

As shown in FIG. 20, a silicon nitride layer having a layer thickness T11 of approximately 200 nm is applied onto at least the insulating substrate 10 of the pixel area LSA by, for example, a plasma chemical vapor deposition (plasma CVD) method. In this way, the first insulating layer 11 is formed. The first insulating layer 11 is formed by the above plasma CVD method at approximately 300° C. to 400° C. as the film-formation temperature, using the plasma generated by a reactant gas including hydrogen (H), such as silane (SiH$_4$) or ammonia (NH$_3$). Thus, the formed first insulating layer 11 includes part of the hydrogen (H) included in the reactive gas.

Figure 21:
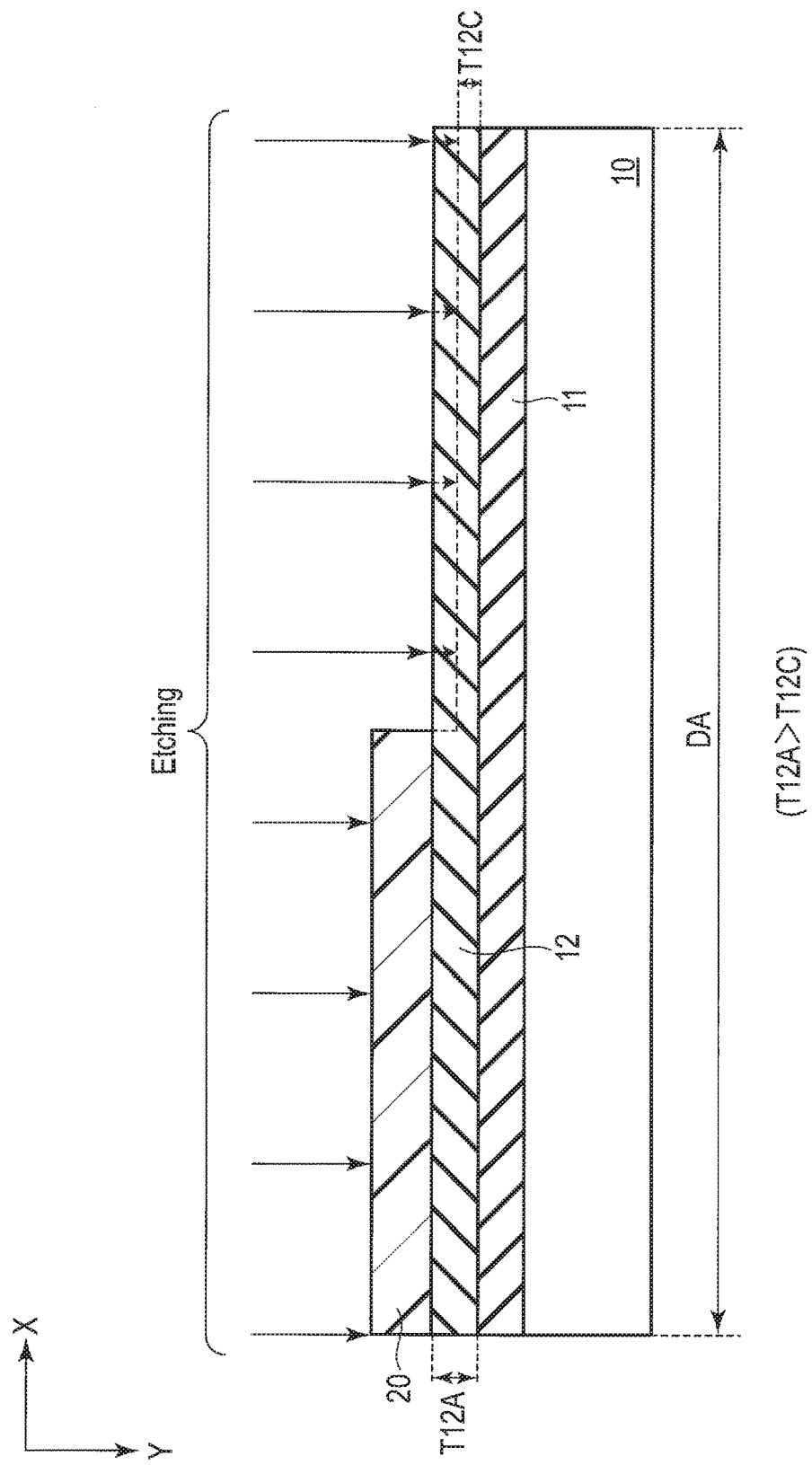
FIG. 21 is a cross-sectional view showing manufacturing step subsequent to FIG. 20.

Subsequently, as shown in FIG. 21, a silicon oxide layer having a layer thickness T12A of approximately 200 nm is applied onto the first insulating layer 11 of the pixel area DA by, for example, a plasma CVD method. In this way, the second insulating layer 12 is formed. Similarly, the second insulating layer 12 is formed by the plasma CVD method, using the plasma generated by a reactant gas including hydrogen (H), such as silane (SiH$_4$) or nitrous oxide (N$_2$O). Similarly, when the second insulating layer 12 is formed, the first insulating layer 11 includes part of the hydrogen (H) included in the reactant gas.

Subsequently, a photoresist 20 is applied onto the entire surface of the second insulating layer 12. The photoresist 20 is patterned such that the surface of the second insulating layer 12 in which the capacitor Cs is formed is exposed. Subsequently, etching such as dry etching with an RIE method or predetermined wet etching is applied with the patterned photoresist 20 as a mask. Layer thickness T12C of the second insulating layer 12C in which the capacitor Cs is formed is reduced to, for example, approximately 50 to 100 nm in the Y-direction. As a result, layer thickness T12C of the second insulating layer 12C in which the capacitor Cs is formed is formed so as to be thinner than layer thickness 112A of the second insulating layer 12A of the thin-film transistor TrA (T12C<T12A).

Figure 22:
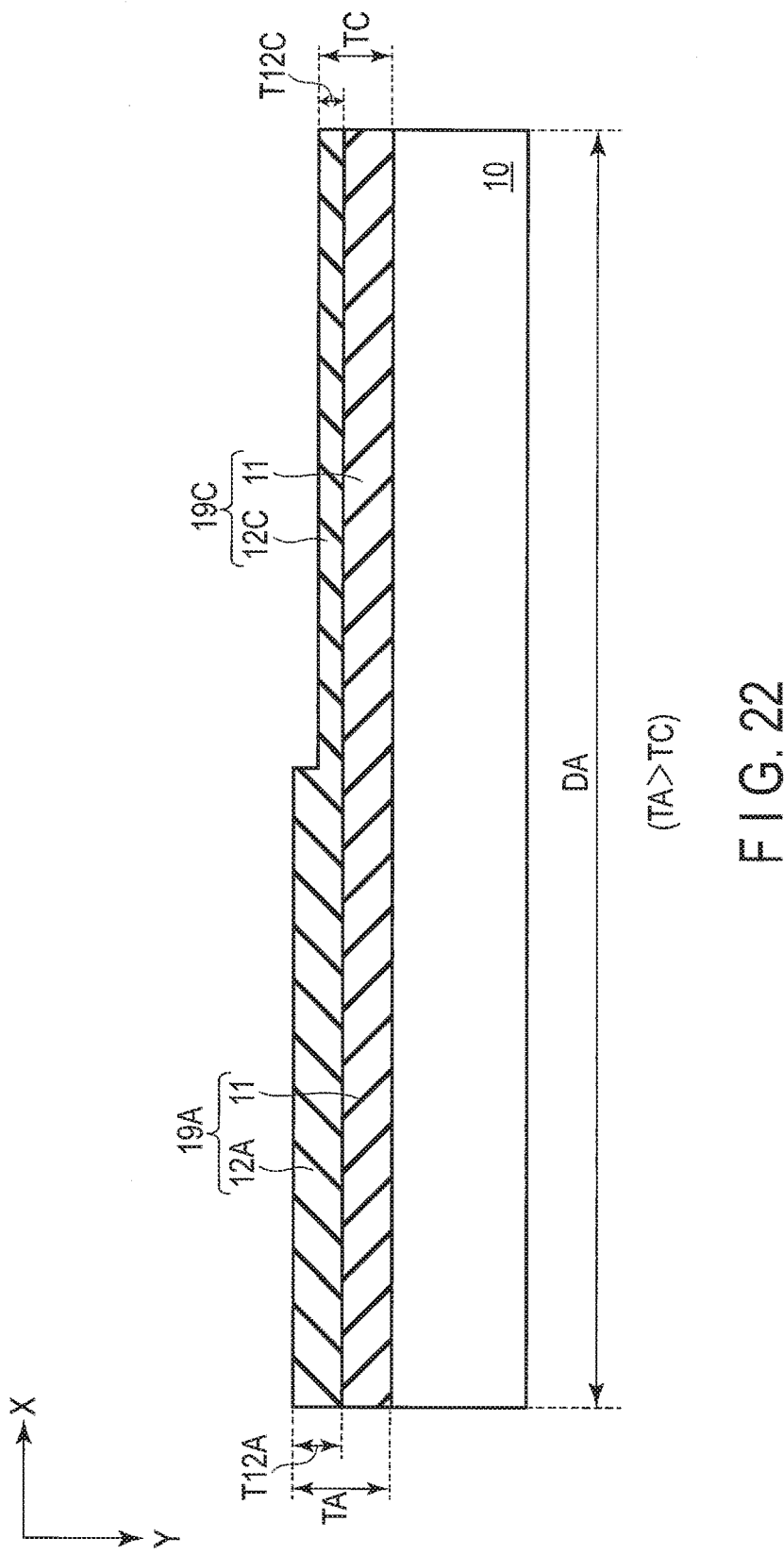
FIG. 22 is a cross-sectional view showing a manufacturing step subsequent to FIG. 21.

Subsequently, as shown in FIG. 22, the photoresist 20 is removed. The underlayer 19A comprising the first and second insulating layers 11 and 12A of the thin-film transistor Tr1 is formed. The underlayer 19C comprising the first and second insulating layers 11 and 12C of the capacitor Cs is formed. As a result, layer thickness TA of the underlayer 19A is formed so as to be thicker than layer thickness TC of the underlayer 19C (TA>TC).

Figure 23:
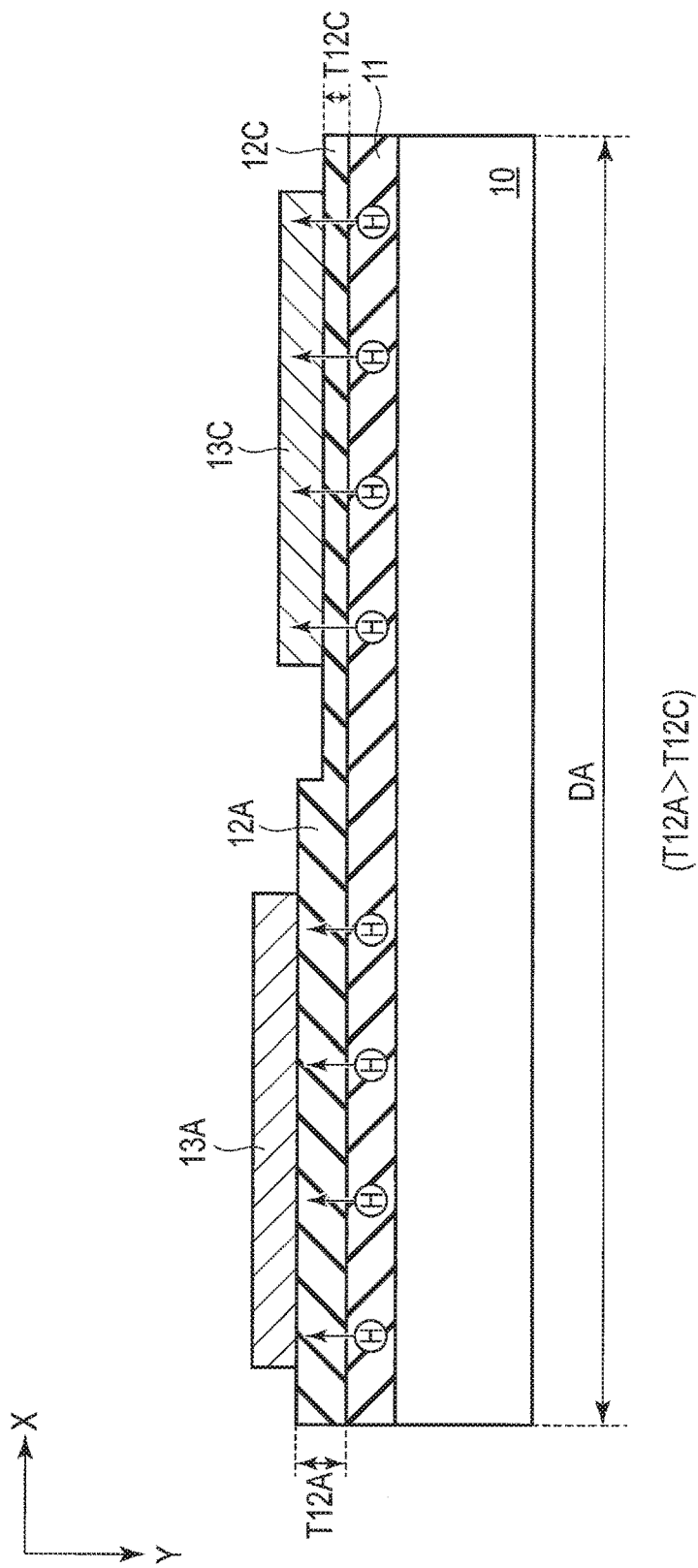
FIG. 23 is a cross-sectional view showing a manufacturing step subsequent to FIG. 22.

Subsequently, as shown in FIG. 23, the oxide semiconductor layers 13A and 13C are formed on the second insulating layers 12A and 12C by, for example, a sputter method, such that the oxide semiconductor layers 13A and 13C include at least one of indium (In), gallium (Ga) and tin (Sn) and are patterned into a desired shape.

The temperature of the first insulating layer 11 in this step is approximately 300° C. to 400° C. as the film-formation temperature. Therefore, the hydrogen (H) included in the first insulating layer 11 is diffused from the first insulating layer 11 to surrounding area. Layer thickness T12A of the second insulating layer 12A provided under the oxide semiconductor layer 13A is thicker than layer thickness T12C of the second insulating layer 12C provided under the oxide semiconductor layer 13C (T12A>T12C). Thus, under the oxide semiconductor layer 13A, the second insulating layer 12A functions as a barrier against the diffused hydrogen and prevents the diffusion of the hydrogen to the oxide semiconductor layer 13A.

Under the oxide semiconductor layer 13C, the layer thickness of the second insulating layer 12C is thin. Thus, the diffused hydrogen reaches the oxide semiconductor layer 13C. Because of the hydrogen reaching the oxide semiconductor layer 13C, the carrier density of the oxide semiconductor layer 13C is increased in comparison with the oxide semiconductor layer 13A. In this manner, the oxide semiconductor layer 13C is made conductive.

Hydrogen is diffused to the oxide semiconductor layer 13C to control the voltage dependence of the capacitance of the capacitor Cs. Hydrogen could be diffused to the whole inside of the oxide semiconductor layer 13C as well as the lower surface of the oxide semiconductor layer 13C. The diffusion of hydrogen from the first insulating layer 11 is not limited to the steps for forming the oxide semiconductor layers 13A and 13C. In any step where the temperature of the first insulating layer 11 is approximately 300° C. to 400° C. as the layer-formation temperature, hydrogen could be diffused from the first insulating layer 11. For example, the voltage dependence of the capacitor Cs may be controlled by using an anneal process after the formation of the thin-film transistor TrA and the capacitor Cs.

Subsequently, a silicon oxide layer is formed on the entire surface as a gate insulating layer which covers the oxide semiconductor layers 13A and 13C by, for example, a CVD method. Subsequently, a metal layer is formed on the silicon oxide layer as a gate electrode by, for example, a sputter method. The metal layer is formed by, for example, a stacked structure of titanium, aluminum and molybdenum nitride.

Figure 24:
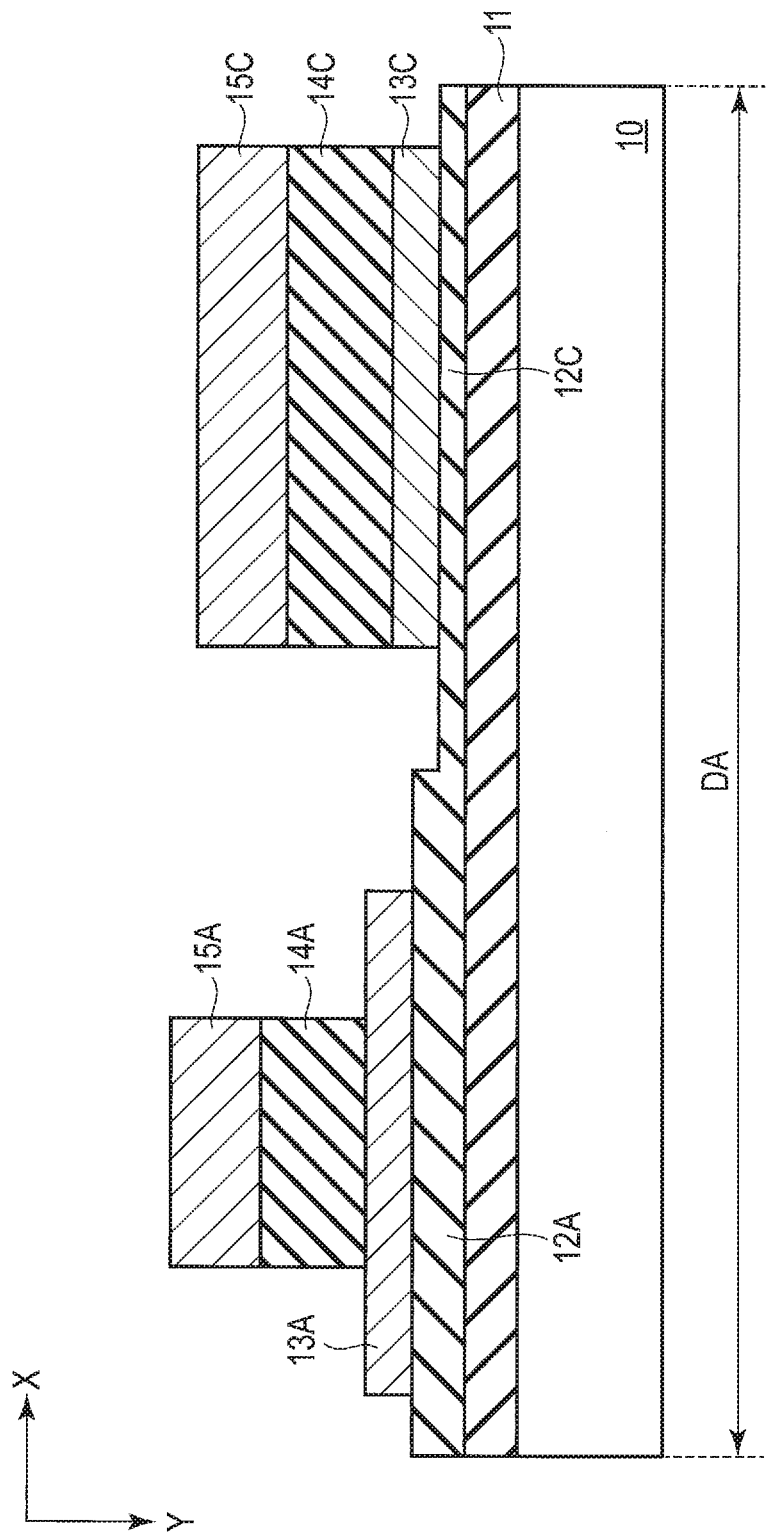
FIG. 24 is a cross-sectional view showing a Manufacturing step subsequent to FIG. 23.

Subsequently, as shown in FIG. 24, for example, a predetermined etching process is applied onto the metal layer with a patterned photoresist (not shown) corresponding to substantially the center of the oxide semiconductor layer 13A and the oxide semiconductor layer 13C as a mask. In this way, the gate electrode 15A and the electrode 15C are formed. Subsequently, the silicon oxide layer is etched by predetermined dry etching, etc. In this way, the gate insulating layer 14A and the capacitor insulating layer 14C are formed. At the time of this etching step, the oxide semiconductor layer 13A is overetched in areas where neither the gate electrode 15A nor the gate insulating layer 14A is formed. In each overetched area of the oxide semiconductor layer 13A, a source/drain area is formed. In the source/drain area, an oxygen defect is generated, and the carrier density of the n-channel MOS transistor is high, and the resistance is low. In the area of the oxide semiconductor layer 13A where overetching is not applied, in other words, in the area covered by the gate insulating layer 14A, a channel area is formed. The carrier density of the channel area is lower than that of the source/drain area.

Figure 25:
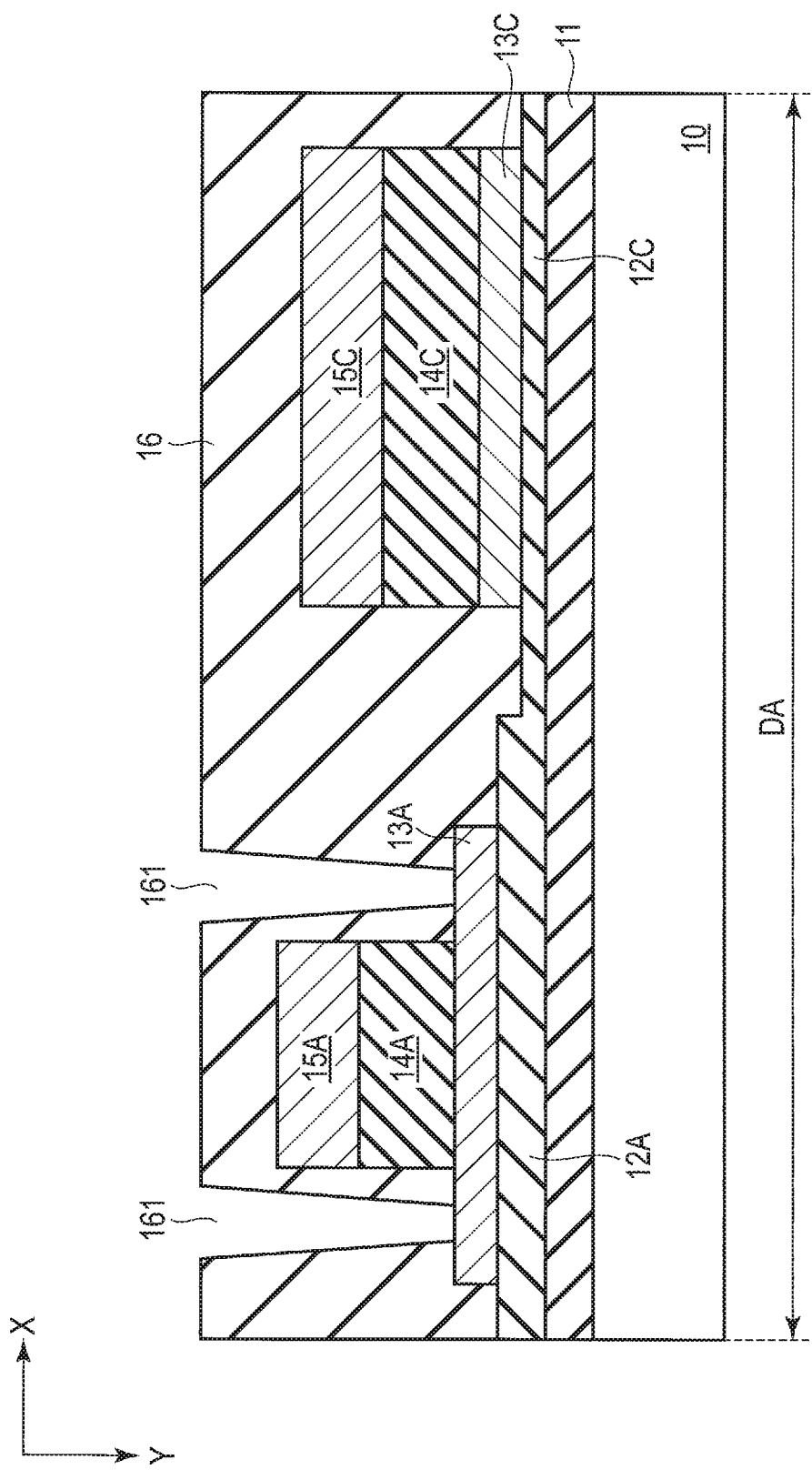
FIG. 25 is a cross-sectional view showing a manufacturing step subsequent to FIG. 24.

Subsequently, as shown in FIG. 25, a silicon oxide layer is formed on the entire surface so as to cover the gate electrode 15 by, for example, a CVD method. In this way, the interlayer insulating layer 16 is formed. Subsequently, each contact hole 161 is formed in the interlayer insulating layer 16 by, for example, an RIE method, so as to reach a corresponding source/drain area of the oxide semiconductor layer 13A.

Figure 26:
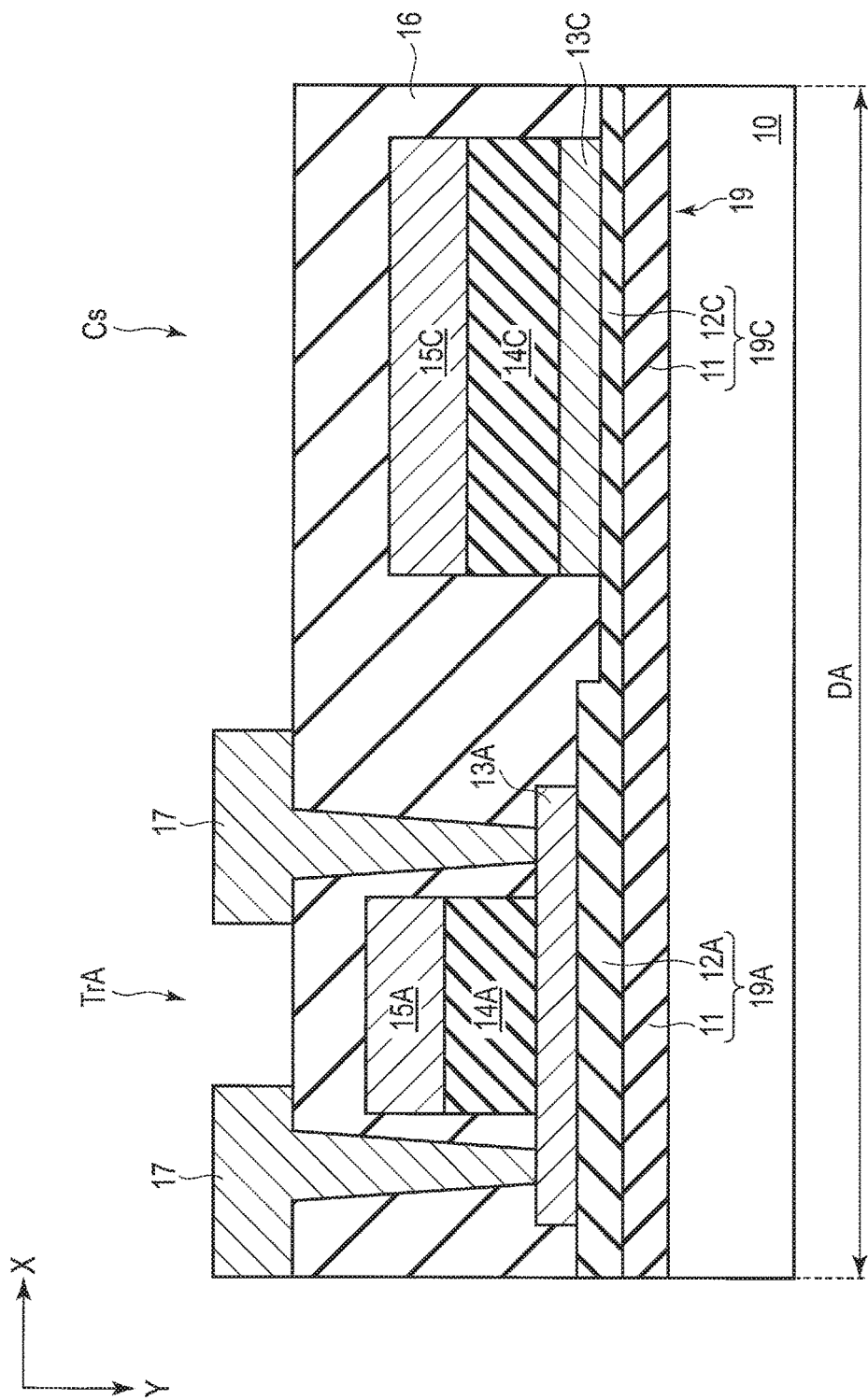
FIG. 26 is a cross-sectional view showing a manufacturing step subsequent to FIG. 25.

Subsequently, as shown in FIG. 26, a metal layer having a stacked structure of molybdenum, aluminum and molybdenum nitride, etc., is buried into each contact hole 161 by, for example, a sputter method. In this way, the contact interconnect 17 of the source/drain area is formed. Subsequently, a silicon oxide layer is formed on the entire surface by, for example, the same step. Thus, the interlayer insulating layer 18 (not shown) is formed.

By the above method, the semiconductor device 1D comprising the thin-film transistor TrA and the capacitor Cs shown in FIG. 18 is manufactured.

[Effects]

As explained above, in the third embodiment, layer thickness T12C of the second insulating layer 12C of the capacitor Cs is configured to so as to be thinner than layer thickness T12A of the second insulating layer 12A of the thin-film transistor TrA (T12C<T12A). As a result, layer thickness TA of the underlayer 19A of the thin layer transistor TrA is configured to so as to be thicker than layer thickness TC of the underlayer 19C of the capacitor Cs (TA>TC).

In the above structure, when the oxide semiconductor layers 13A and 13C are formed as shown in FIG. 23, the second insulating layer 12A functions as a barrier against the hydrogen diffused from the first insulating layer 11 and prevents the diffusion of the hydrogen to the oxide semiconductor layer 13A under the oxide semiconductor layer 13A. Under the oxide semiconductor layer 13C, the layer thickness of the second insulating layer 12C is thin. Thus, the hydrogen diffused from the first insulating layer 11 reaches the oxide semiconductor layer 13C. Because of the hydrogen reaching the oxide semiconductor layer 13, the resistance of the oxide semiconductor layer 13C is made low in comparison with the oxide semiconductor layer 13A. Thus, the oxide semiconductor layer 13C is made conductive.

In this way, the carrier densities of the oxide semiconductor layers 13A and 13C of the thin-film transistor TrA and the capacitor Cs adjacent to each other in the pixel area DA can be configured to so as to be different from each other. Thus, the resistance of the oxide semiconductor layer 13C of the capacitor Cs can be made low in comparison with the oxide semiconductor layer 13A of the thin-film transistor TrA. In this manner, the oxide semiconductor layer 13C of the capacitor Cs can be made conductive.

In the above structure, as shown in, for example, FIG. 19, property C-Cs of the capacitor Cs shows that high capacitance C1 is maintained substantially constant regardless of the voltage V applied to the capacitor Cs. Thus, capacitance C substantially does not depend on voltage or does not change. As described later, when the capacitor Cs of the present embodiment is applied to the capacitance element included in a pixel, the capacitance does not change, and thus, the available capacitance is stable. In this way, the image quality of the pixel area can be improved.

The carrier density can be configured to so as to differ between the oxide semiconductor layers 13A and 13C by merely controlling the reduction in layer thickness T12C of the second insulating layer 12C, for example, by adjusting the etching time in the etching process shown in FIG. 21. In other words, only the etching time of the second insulating layer 12C corresponding to an area in which the capacitor Cs is formed may be controlled to reduce layer thickness T12C to, for example, approximately 50 nm. For example, a layer-formation step for adding a conductive layer to the capacitor Cs is not needed. Thus, in the present embodiment, when the layer thickness of the second insulating layer 12C of the underlayer 19C is controlled, the oxide semiconductor layer 13C can be made conductive without increasing the number of layer-formation steps. As a result, the manufacturing cost can be also reduced.

Modification Example 3

Figure 27:
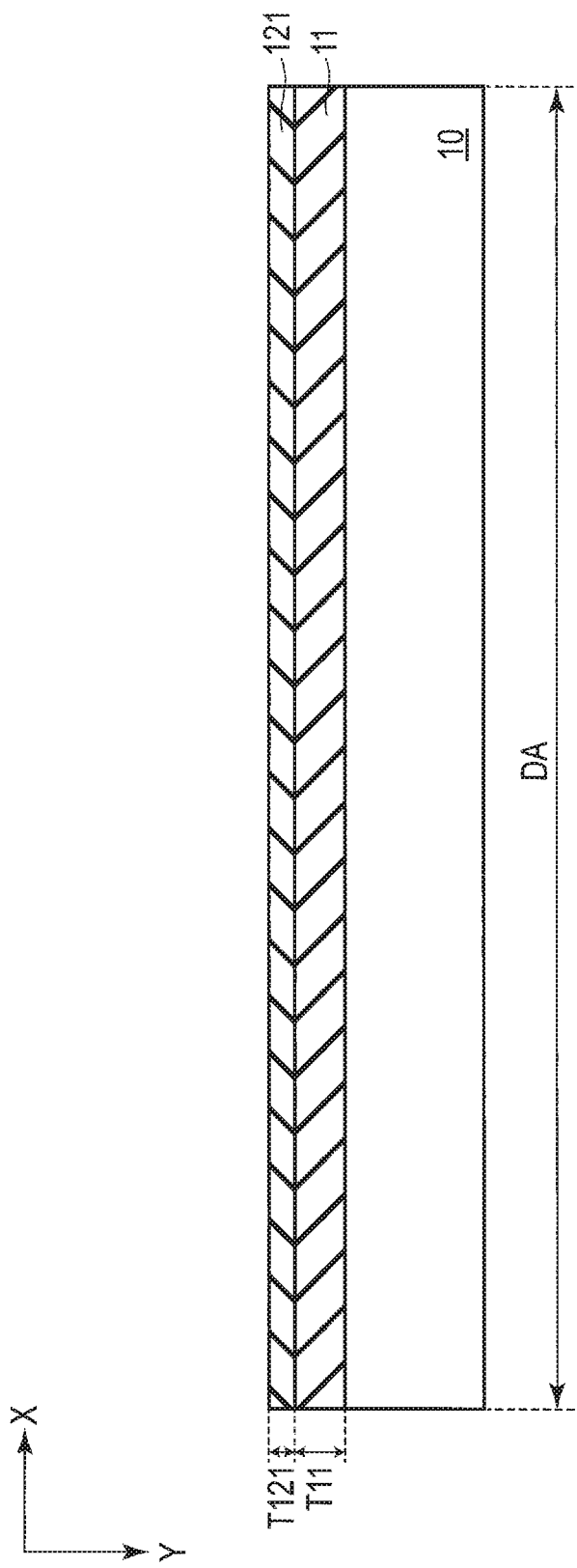
FIG. 27 is a cross-sectional view showing an example of the method for manufacturing the semiconductor device applied to an active matrix substrate according to modification example 3.
Figure 29:
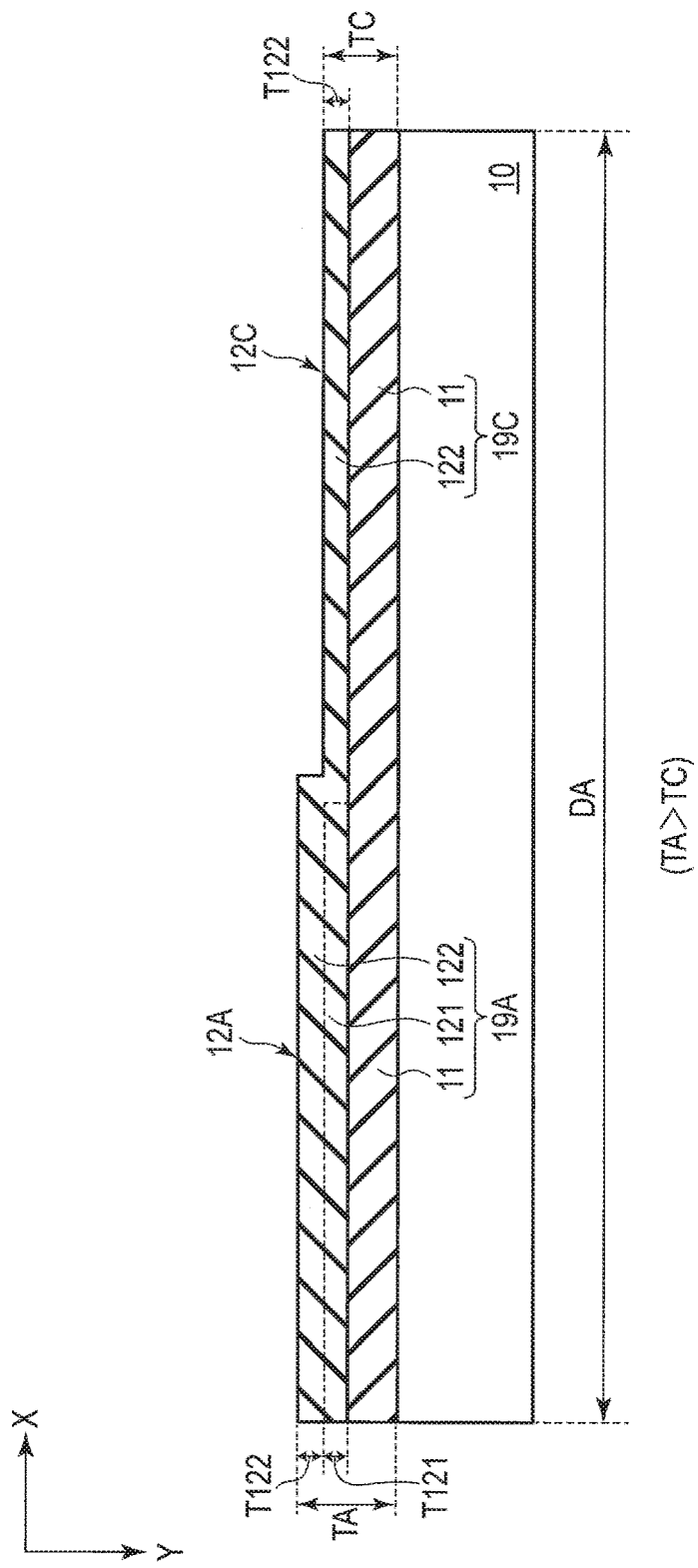
FIG. 29 is a cross-sectional view showing a manufacturing step subsequent to FIG. 28.

Next, this modification example 3 explains another method for manufacturing the semiconductor device 1D according to the third embodiment, referring to FIG. 27 to FIG. 29. The structure is substantially the same as that of the third embodiment. Thus, the detailed description thereof is omitted.

[Manufacturing Method]

As shown in FIG. 27, a silicon nitride layer having a layer thickness T11 of approximately 200 nm is applied onto the insulating substrate 10 of the pixel area DA by, for example, a plasma CVD method. In this way, the first insulating layer 11 is formed.

Subsequently, a silicon oxide layer having a layer thickness T121 of approximately 100 nm is applied onto the first insulating layer 11 of the pixel area DA by, for example, a plasma CVD method. In this way, an insulating layer 121 is formed.

Subsequently, as shown in FIG. 28, a photoresist 21 is applied onto the entire surface, and is patterned such that the surface of the insulating layer 121 in which the capacitor Cs is formed is exposed. Subsequently, etching is applied to the extent of the surface of the first insulating layer 11 in the Y-direction with the patterned photoresist 21 as a mask by, for example, an RIE method. Thus, the insulating layer 121 in which the capacitor Cs is formed is removed.

Subsequently, as shown in FIG. 29, the photoresist 21 is removed. A silicon oxide layer having a layer thickness T122 of approximately 100 nm is applied onto the entire surface in the pixel area DA by, for example, a plasma CVD method. In this way, an insulating layer 122 is formed.

As a result, the underlayer 19C comprising the first insulating layer 11 and the second insulating layer 122 (12C) is formed in the area where the capacitor Cs is formed. In the area where the thin-film transistor TrA is formed, the underlayer 19A comprising the first insulating layer 11 and the second insulating layers 121 and 122 (in other words, the second insulating layer 12A) is formed. Thus, layer thickness TC of the underlayer 19C is formed so as to be thinner than layer thickness TA of the underlayer 19A (TC<TA).

Subsequently, the same manufacturing method as that of the third embodiment is used. In this manner, the semiconductor device 1D is manufactured.

[Effects]

Effects similar to those of the third embodiment can be obtained by the structure of modification example 3 and its manufacturing method. Furthermore, in modification example 3, the insulating layer 122 is formed on the entire surface in the pixel area DA after the removal of the insulating layer 121 in which the capacitor Cs is formed (FIG. 28 and FIG. 29). Thus, when the insulating layer 121 in which the capacitor Cs is formed is removed, and further when the second insulating layer 122 formed, the difference in the layer thickness (TA>TC) can be further assured in comparison with when the layer thickness is controlled by etching. Thus, the resistance of the oxide semiconductor layer 13C can be further certainly made low. It is possible to further ensure that the capacitance of the capacitor Cs does not depend on voltage.

Modification Example 4 [Example in which the Underlayer does not Comprise the Second Insulating Layer]

Figure 30:
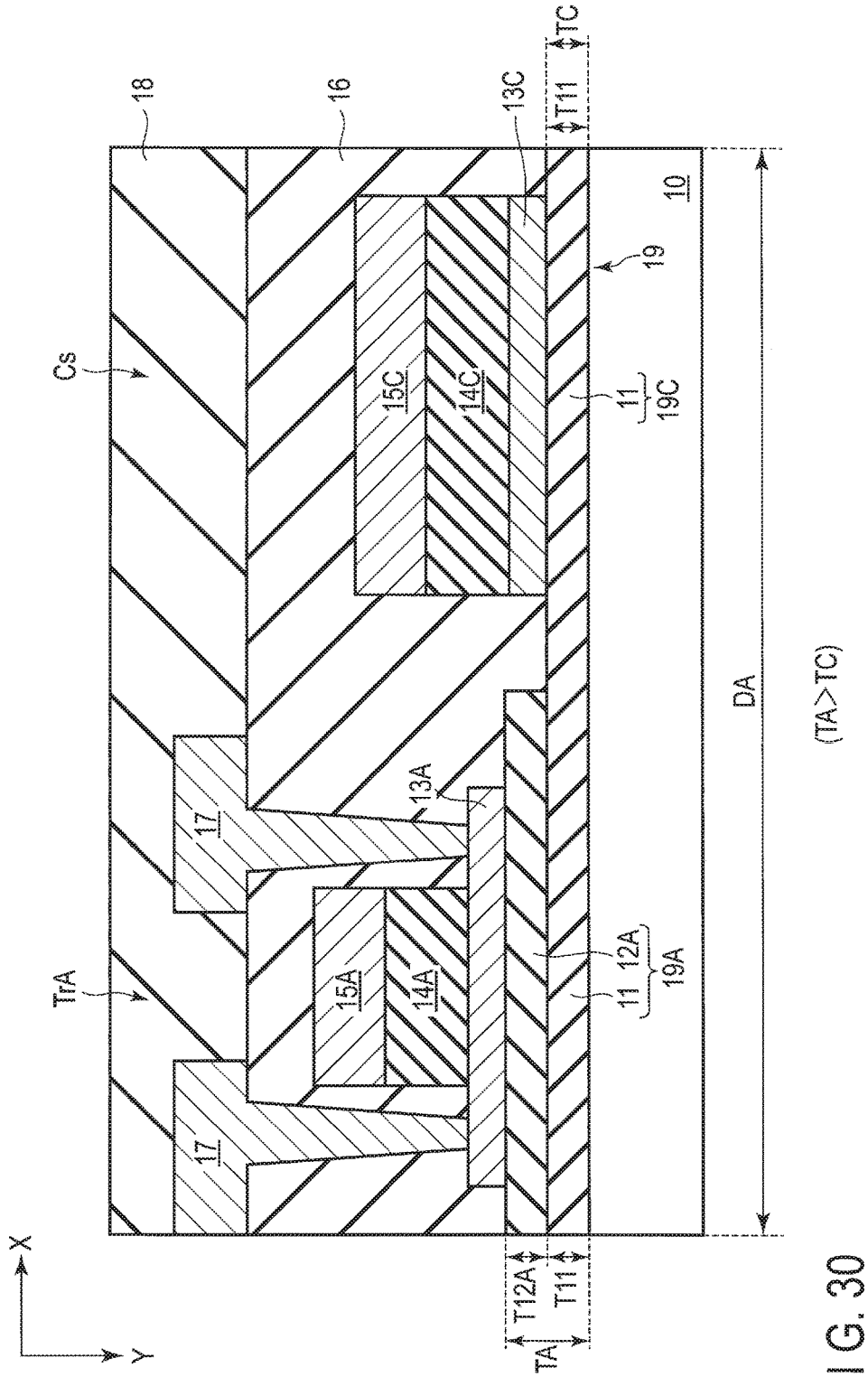
FIG. 30 is a cross-sectional view schematically showing an example of the semiconductor device applied to an active matrix substrate according to modification example 4.

This example explains a semiconductor device 1E according to modification example 4 of the third embodiment with reference to FIG. 30. The semiconductor device 1E according to modification example 4 relates to an example in which the underlayer 19C of the capacitor Cs does not comprise the second insulating layer 12. FIG. 30 is a cross-sectional view schematically showing an example of the semiconductor device 1E applied to an active matrix substrate according to modification example 4.

[Structure]

As shown in FIG. 30, in the semiconductor device 1E of modification example 4, the underlayer 19C does not comprise the second insulating layer 12A and comprises only the first insulating layer 11 comparison with the third embodiment and modification example 3. In other words, the layer thickness of the second insulating layer 12C of the underlayer 19C of the capacitor Cs according to modification example 4 is substantially zero.

The other structures are substantially the same as those of the third embodiment and modification example 3. Thus, the detailed description thereof is omitted.

[Manufacturing Method]

The manufacturing method differs from that of the third embodiment in the following respect. For example, the etching time is longer than that of the third embodiment in the etching process shown in FIG. 21. The second insulating layer 12C of the capacitor Cs is etched to the extent that the surface of the first insulating layer 11 is exposed. In other words, in the etching process, etching is applied until layer thickness T12C of the second insulating layer 12C becomes substantially zero.

The other structures are substantially the same as those of the third embodiment and modification example 3. Thus, the detailed description thereof is omitted.

[Effects]

In the semiconductor device 1E according to modification example 4, the underlayer 19C of the capacitor Cs does not comprise the second insulating layer 12C and comprises only the first insulating layer 11.

Thus, the underlayer 19C of the capacitor Cs does not comprise the second insulating layer 12 which functions as a barrier against the hydrogen diffused from the first insulating layer 11. Thus, the hydrogen diffused from the first insulating layer 11 is directly diffused to the oxide semiconductor layer 13C. As a result, the carrier density of the oxide semiconductor layer 13C according to modification example 4 is further increased in comparison with the third embodiment and modification example 3. Thus, the resistance of the oxide semiconductor layer 13C is made low. In this way, the oxide semiconductor layer 13C is further made conductive. In modification example 4, it is possible to further directly and certainly make the oxide semiconductor layer 13C conductive and impair the voltage dependence of the capacitance of the capacitor Cs.

The second insulating layer 12C of the capacitor Cs is entirely removed. Thus, there is no need to maintain the thin second insulating layer 12C in comparison with the third embodiment. Thus, the manufacturing process can be simplified in comparison with the third embodiment.

Fourth Embodiment [Example in Which the Layer Thickness of the First Insulating Layer as a Source of Hydrogen is Controlled]

This embodiment explains the structure of a semiconductor device 1F and a method for manufacturing the semiconductor device 1F according to a fourth embodiment with, reference to FIG. 31 to FIG. 34. The fourth embodiment relates to an example in which the layer thickness of a first insulating layer 11 as a source of hydrogen (H) is controlled. With respect to the explanation of the fourth embodiment, the detailed description of portions substantially overlapping the third embodiment is omitted.

[Structure]

In the third embodiment, layer thickness T11 of the first insulating layer 11 as a source of hydrogen is the same (uniform) in the pixel area DA while layer thickness T12 of the second insulating layer 12 as a barrier layer which prevents the diffusion of hydrogen is nonuniform.

Figure 31:
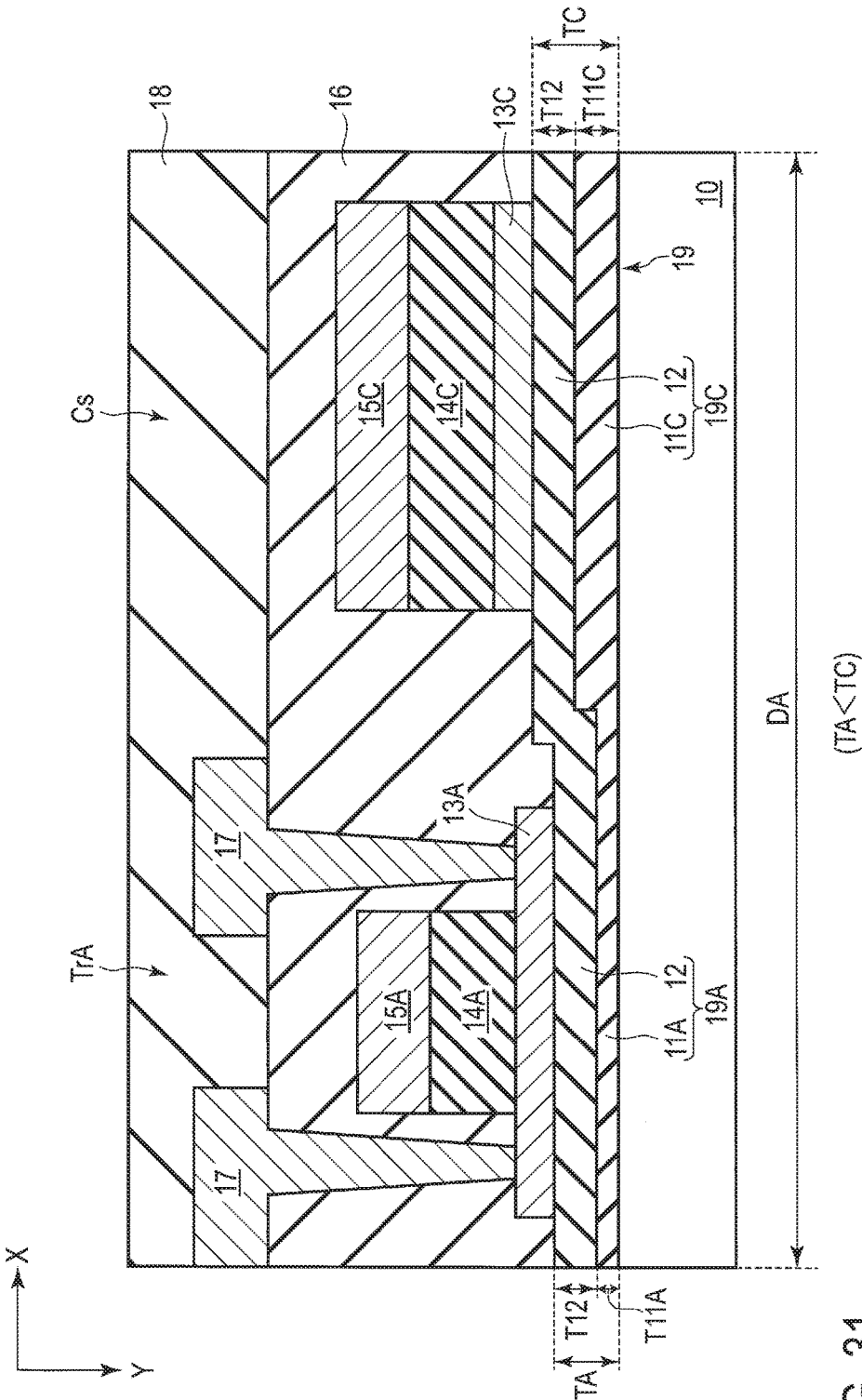
FIG. 31 is a cross-sectional view showing a semiconductor device applied to an active matrix substrate according to a fourth embodiment.

In the fourth embodiment shown in FIG. 31, layer thickness T11C of a first insulating layer 11C in which a capacitor Cs is formed is configured to so as to be thicker than layer thickness T11A of a first insulating layer 11A in which a thin-film transistor TrA is formed (T11C>T11A). Layer thickness T12 of a second insulating layer 12 is substantially uniform in a pixel area DA. As a result, in the fourth embodiment, layer thickness TA of an underlayer 19A is configured to so as to be thinner than layer thickness TC of an underlayer 19C (TA<TC).

When the underlayers 19A and 19C have the above structures, the amount of hydrogen (H) generated from the first insulating layer 11C of the capacitor Cs is greater than that generated from the first insulating layer 11A of the thin-film transistor TrA. Layer thickness T12 of the second insulating layer 12 as a barrier layer which prevents the diffusion of hydrogen (H) is the same (uniform) in the pixel area DA.

Thus, an oxide semiconductor layer 13C provided in the capacitor Cs has a high carrier density and a low resistance in comparison with an oxide semiconductor layer 13A provided in the thin-film transistor TrA. As a result, similarly, the capacitor Cs can be provided such that capacitance C does not depend on voltage.

The other structures are substantially the same as those of the third embodiment. Thus, the detailed description thereof is omitted.

[Manufacturing Method]

Figure 32:
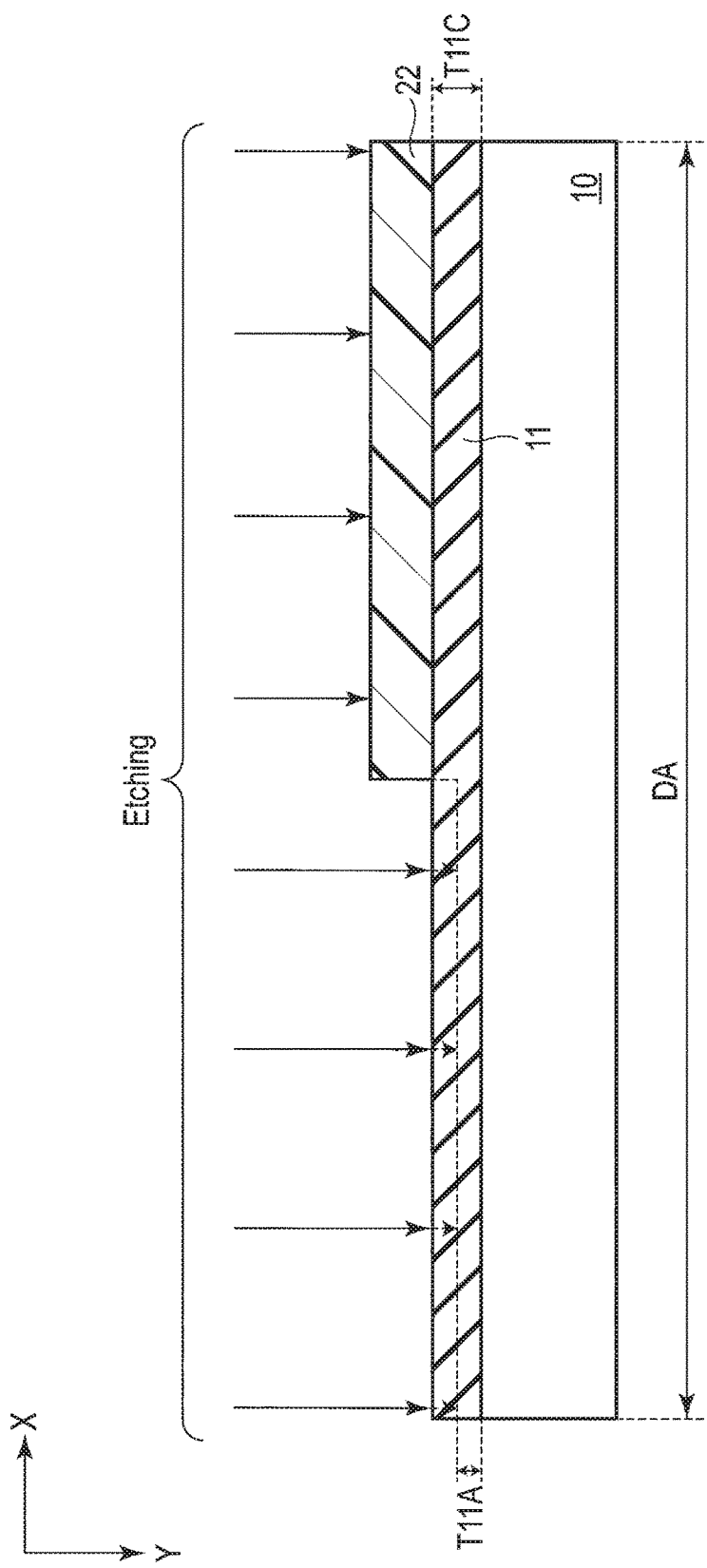
FIG. 32 is a cross-sectional view showing an example of a method for manufacturing the semiconductor device shown in FIG. 31.
Figure 33:
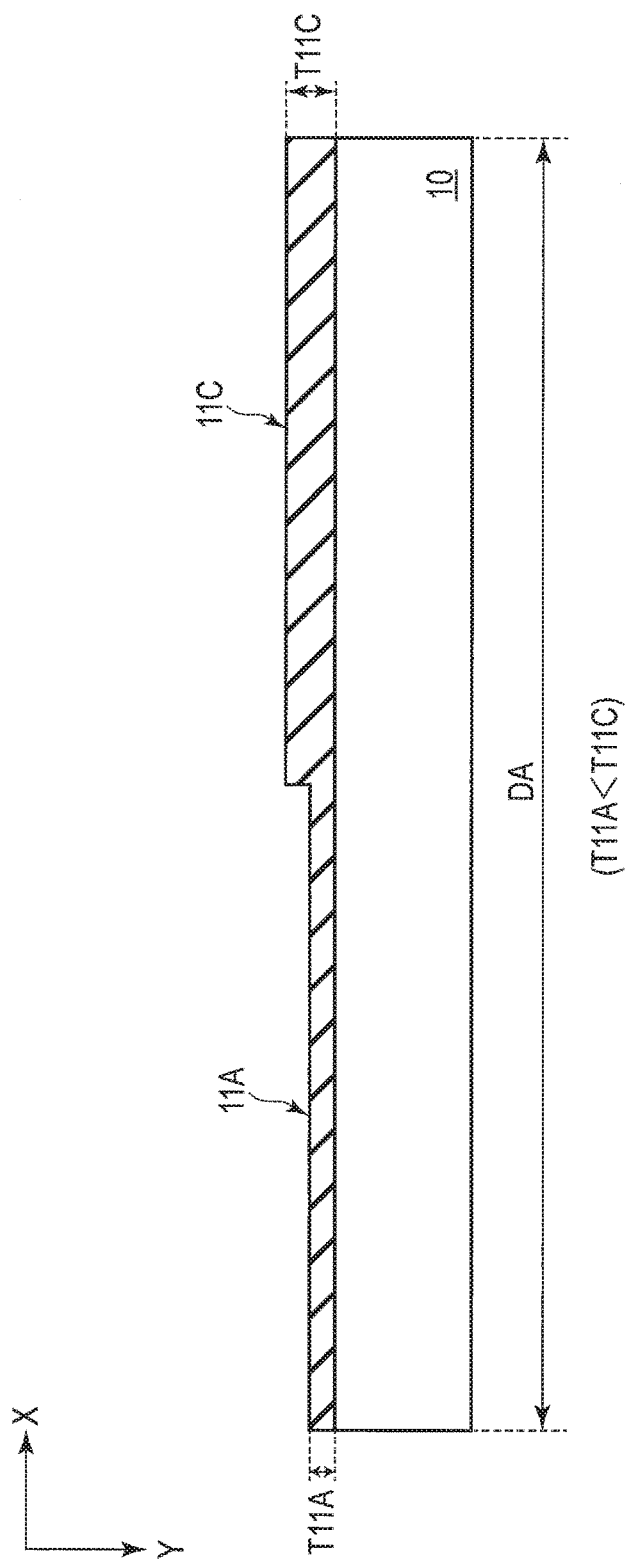
FIG. 33 is a cross-sectional view showing a manufacturing step subsequent to FIG. 32.
Figure 34:
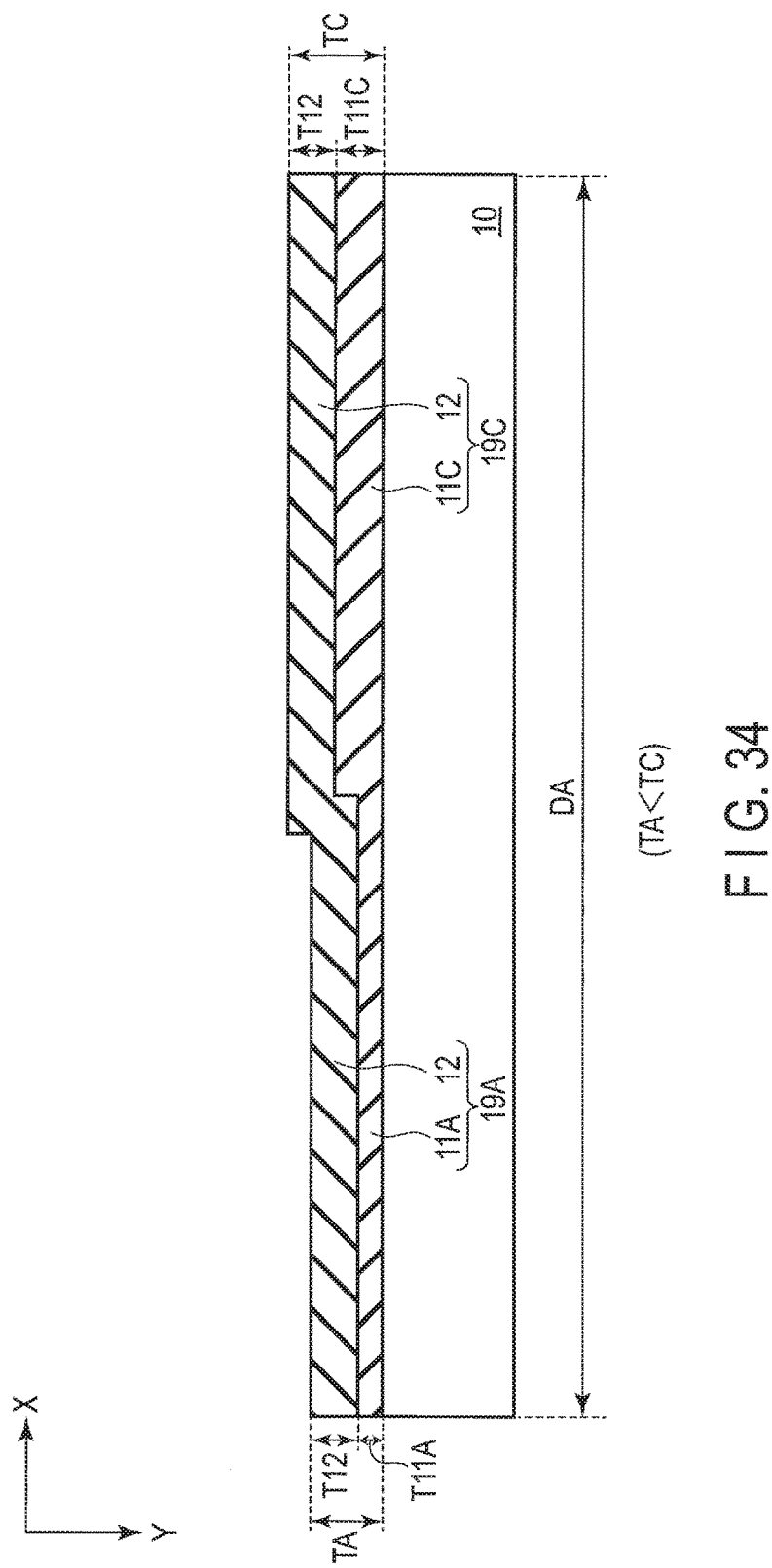
FIG. 34 is a cross-sectional view showing a manufacturing step subsequent to FIG. 33.

Next, this embodiment explains a method for manufacturing the semiconductor device 1F according to the fourth embodiment, referring to FIG. 32 to FIG. 34.

As shown in FIG. 32, a silicon nitride (SiN) layer having a layer thickness T11C of approximately 200 nm is applied onto an insulating substrate 10 in the pixel area DA by, for example, a plasma CVD method. In this way, the first insulating layer 11 is formed. Similarly, the first insulating layer 11 is formed at approximately 300° C. to 400° C. as the layer-formation temperature, using hydrogen (H) as the reactant gas of the plasma CVD. Thus, the formed first insulating layer 11 includes part of the hydrogen (H) used by the method.

Subsequently, a photoresist 22 is applied onto the entire surface. The photoresist 22 is patterned such that the surface of the first insulating layer 11 of the thin-film transistor TrA is exposed. Subsequently, etching is applied by, for example, an RIE method with the patterned photoresist 22 as a mask. For example, the etching time is controlled such that layer thickness T11A of the first insulating layer 11A of the thin-film transistor TrA is reduced to approximately 100 nm in the Y-direction.

Subsequently, as shown in FIG. 33, the photoresist 22 is removed. As a result, layer thickness T11A of the first insulating layer 11A of the thin-film transistor TrA is formed so as to be thinner than layer thickness T11C of the first insulating layer 11C of the capacitor Cs (T11A<T11C).

Subsequently, as shown in FIG. 34, similarly, a silicon oxide layer having a layer thickness T12 of approximately 200 nm is applied onto the formed first insulating layers 11A and 11C of the pixel area DA by, for example, a plasma CVD method. In this way, the second insulating layer 12 is formed. As a result, the underlayer 19A comprising the first and second insulating layers 11A and 12 and the underlayer 19C comprising the first and second insulating layers 11C and 12 are formed in the pixel area DA. Thus, layer thickness TA of the underlayer 19A is formed so as to be thinner than layer thickness TC of the underlayer 19C (TA<TC).

Subsequently, the same manufacturing method as the above description is used. In this manner, the semiconductor device 1F of the fourth embodiment is manufactured.

[Effects]

Effects similar to those of the third embodiment can be obtained by the structure of the fourth embodiment and its manufacturing method. Further, the fourth embodiment can be applied where necessary.

Application Example [OEL Display Device]

Next, this example explains an example of a display device to which the semiconductor devices 1A to 1F of the first to fourth embodiments and modification examples 1 to 4 can be applied, referring to FIG. 35 and FIG. 36. The display device 1 shown in FIG. 35 is, for example, an active-matrix type of OEL display device comprising an OEL element. The OEL display device 1 explained here is merely an example. The display device is not limited to this example.

[Overall Structure of Display Device]

The overall structure of the display device 1 is explained with reference to FIG. 35. FIG. 35 is a block diagram schematically showing an example of the display device 1 to which the active matrix substrates according to the first and second embodiments and modification example 1 can be applied. As shown in FIG. 35, the display device 1 comprises a pixel area DA, and a drive unit provided in a peripheral circuit area PA around the pixel area DA. The drive unit includes a first scanning line drive circuit 3, a second scanning line drive circuit 4, a data line drive circuit 5, a control circuit 6 and a power supply circuit 7.

For example, the first scanning line drive circuit 3 and the second scanning line drive circuit 4 are provided near the both ends of the pixel area DA in the row direction. The data line drive circuit 5, the control, circuit 6 and the power supply circuit 7 are provided near one end of the pixel area DA in the column direction. The first scanning line drive circuit 3, the second scanning line drive unit 4 and the data line drive circuit 5 are at least partially provided on a panel (not shown) included in the display device 1.

The pixel area DA comprises a plurality of pixels PX arranged in matrix (in other words, in rows and columns). In a manner corresponding to the pixels PX, the pixel area DA includes a plurality of first scanning lines WL and a plurality of scanning lines RL in the row direction, and a plurality of data lines DL in the column direction intersecting with the row direction.

The first thin-film transistor TrA of each of the first to fourth embodiments and modification examples 1 to 4 is applied to the switching element included in each pixel PX of the pixel area DA as described later. The second thin-film transistor TrB is applied to a peripheral transistor provided in a peripheral circuit such as a protective circuit in the peripheral circuit area PA.

The first scanning lines WL extend to the outside of the pixel area DA, and are electrically connected to the first scanning line drive circuit 3. The second scanning lines RL extend to the outside of the pixel area DA, and are electrically connected to the second scanning line drive circuit 4. The data lines DL extend to the outside of the pixel area DA, and are electrically connected to the data line drive circuit 5.

The first scanning line drive unit 3 sequentially supplies a write scanning signal WS to the first scanning lines WL. In this manner, the pixels PX arranged in the row direction are sequentially selected.

The second scanning line drive circuit 4 supplies a drive scanning signal AZ, to the second scanning lines RL in synchronization with the write scanning signal WS supplied by the first scanning line drive circuit 3. In this manner, the light-emitting operation and the light-quenching operation of the pixels PX are controlled.

The data line drive circuit 5 selectively supplies, for example, signal voltage Vsig and reference voltage Vofs, to the data lines DL. The signal voltage Vsig is the voltage of a signal based on the luminance of a video signal. The reference voltage Vofs is the reference voltage of the signal voltage, and is equivalent to, for example, the voltage of a signal indicating a black level. The reference voltage Vofs is also used to correct the variation in the threshold voltage of a drive transistor which drives an OEL element as described later.

The control circuit 6 generates various types of signals necessary to display an image in the pixel area PA based on an external signal supplied from an external signal source. The control circuit 6 outputs the generated signals to the first scanning line drive circuit 3, the second scanning line drive circuit 4 and the data line drive circuit 5, and controls the first scanning line drive circuit 3, the second scanning line drive circuit 4 and the data line drive circuit 5 such that they operate in synchronization with each other.

[Detailed Structures of Pixel Area and Peripheral Circuit Area]

Next, this example explains the detailed structures of the pixel area DA and the peripheral circuit area PA of the display device 1 with reference to FIG. 36. FIG. 36 is an equivalent circuit diagram schematically showing an example of the structure of each pixel PX of the pixel area DA and the peripheral circuit area PA.

(Pixels PX)

As shown in FIG. 36, each pixel PX comprises a write transistor Tr1, a drive transistor Tr2, a reset transistor Tr3, a capacitance element Cs and a light-emitting element EL. Each of the write transistor Tr1, the drive transistor Tr2 and the reset transistor Tr3 is the first thin-film transistor TrA. The capacitance element Cs is the capacitor Cs.

The gate electrode of the write transistor Tr1 is connected to the first scanning line WL. One of the source and drain electrodes of the write transistor Tr1 is connected to the data line DL. The other one is connected to the first electrode of the capacitance element Cs and the gate electrode of the drive transistor Tr2.

One of the source and drain electrodes of the drive transistor Tr2 is connected to the line to which power source voltage Vcc is applied. The other one is connected to the anode electrode of the light-emitting element. EL, the second electrode of the capacitance element Cs and one of the source and drain electrodes of the reset transistor Tr3. Cathode voltage Vcath is applied to the cathode electrode of the light-emitting element EL.

The gate electrode of the reset transistor Tr3 is connected to the second scanning line RL. The other one of the source and drain electrodes of the reset transistor Tr3 is connected to the line to which fixed voltage Vini is applied.

In the pixel PX having the above structure, the write transistor Tr1 is in a conductive state when a write scanning signal WS is supplied to the first scanning line WL. In a conductive state, the write transistor Tr1 applies, to the gate electrode of the drive transistor Tr2, the signal voltage Vsig or the reference voltage Vofs applied via the data line DL. The capacitance element Cs retains the signal voltage Vsig or the reference voltage Vofs. When the voltage retained by the capacitance element Cs exceeds the threshold voltage, the drive transistor Tr2 is made conductive and supplies current based on the voltage retained by the capacitance element Cs to the light-emitting element EL. The light-emitting element EL emits light with luminance corresponding to the current supplied from the drive transistor Tr2.

When a drive scanning signal AZ is supplied to the second scanning line RL, the reset transistor Tr3 is in a conductive state. In a conductive state, the reset transistor Tr3 supplies the fixed voltage Vini to the source electrode of the drive transistor Tr2 and the anode electrode of the light-emitting element EL, and resets (initializes) the voltage of these electrodes to the fixed voltage Vini. When the threshold voltage of the light-emitting element EL is Vth, the relationships between the threshold voltage Vth, the cathode voltage Vcath and the fixed voltage Vini are shown as follows:

$$Vini<Vth+Vcath$$

(Peripheral Circuit)

Next, this example explains a peripheral circuit provided in the peripheral circuit area PA. Here, as an example of the peripheral circuit, this example explains a protective circuit ESD which protects each pixel PX provided in the pixel area DA from electro-static discharge (ESD).

The protective circuit ESD comprises two protective transistors Tr4 and Tr5. Each of the two protective transistors Tr4 and Tr5 is the second thin-film transistor TrB.

The gate electrode of the protective transistor Tr4 is connected to one of the source and drain electrodes of the protective transistor Tr4 via the first scanning line WL and line L1. The other one of the source and drain electrodes is connected to the gate electrode of the protective transistor Tr5 and the data line DL, via line L2.

The gate electrode of the protective transistor Tr5 is connected to one of the source and drain electrodes of the protective transistor. Tr5 via line L2. The other one of the source and drain electrodes is connected to one of the source and drain electrodes of the protective transistor Tr4, and is connected to the gate electrode of the protective transistor Tr4 and the first scanning line WL via line L1.

It is assumed that, in the above structure of the protective circuit ESD, voltage Vesd which is higher than threshold voltage VthB of the protective transistors Tr4 and Tr5 is applied to the first scanning line WL by, for example, electro-static discharge. In this case, since voltage Vesd is higher than threshold voltage VthB, the current path of the protective transistors Tr4 and Tr5 is in a conductive state, and can be supplied with drain current. Thus, high voltage Vesd is not applied to the pixel PX in the pixel area DA since high voltage Vesd is applied via the current path of the protective transistors Tr4 and Tr5 in a conductive state and lines L1 and L2. In this way, high voltage Vesd is applied to the peripheral circuit area PA via the data line DL.

By the above operation, each pixel PX in the pixel area DA can be protected from high voltage Vesd applied by electro-static discharge.

[Effects]

When the active matrix substrate and the first and second thin-film transistors TrA and TrB of the first and second embodiments and modification examples 1 and 2 are applied to the display device 1 having the above structure, it is possible to improve the image quality and the reliability of the display device 1. Thus, the leak current and the electricity consumption can be reduced.

Furthermore, it is possible to apply the thin-film transistor TrA, the capacitor Cs and the active matrix substrate on which they are mounted according to the third and fourth embodiments and modification examples 3 and 4 to the display device 1 having the above structure. Specifically, the thin-film transistor TrA may be applied to the switching element included in each pixel PX. The capacitor Cs can be applied to the capacitance element. In this way, it is possible to substantially eliminate the voltage dependence of capacitance C of the capacitance element Cs. In this way, the capacitance element Cs is capable of supplying desired capacitance C which substantially does not depend on voltage. As a result, the image quality of each pixel PX in the pixel area. DA can be improved.

OTHER APPLICATION EXAMPLES

The display device is not limited to the OEL display device 1 explained in the above application example, and may be another display device such as a liquid crystal display device comprising a liquid crystal layer.

The semiconductor devices 1A to 1F may be applied to, for example, an imaging device as well as a display device. In the imaging device, the first thin-film transistor TrA may be applied to each transistor included in each pixel provided in the pixel area PA. The second thin-film transistor TrB may be applied to, for example, each peripheral transistor included in a peripheral circuit provided in the peripheral circuit area PA around the pixel area DA.

The peripheral circuit to which the second thin-film transistor TrB is applicable is not limited to the protective circuit ESD. The second thin-film transistor TrB may be applied to, for example, an inspection transistor which is provided in the peripheral circuit area PA and inspects the image quality of the pixels PX. One of the source and drain electrodes of the inspection transistor is electrically connected to the data bus line connected to the pixels PX in the pixel area DA. The pixel area CA is inspected based on whether or not each pixel PX which is electrically connected emits light with an appropriate luminance, using the on/off-state of the inspection transistor.

As a matter of course, it is possible to apply a structure or a manufacturing method obtained by combining the technical matters disclosed in the first to fourth embodiments and modification examples 1 to 4. While certain embodiments have been described, these embodiments have been presented by way of example only, and are not intended to limit the scope of the inventions indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    an insulating substrate including a pixel area and a peripheral circuit area around the pixel area;
    a first insulating layer which is provided on the insulating substrate and includes at least nitrogen;
    a second insulating layer on the first insulating layer, wherein at least a portion of the second insulating layer is configured to block hydrogen from the first insulating layer;
    a first thin-film transistor which is provided above the first insulating layer in the pixel area and comprises a first oxide semiconductor layer; and
    a second thin-film transistor which is provided on the second insulating layer in the peripheral circuit area and comprises a second oxide semiconductor layer, wherein the second insulating layer in the pixel area is thinner than that in the peripheral circuit area.

2. The device of claim 1, wherein the first insulating layer is uniform in the pixel area and the peripheral circuit area.

3. The device of claim 1, wherein threshold voltage of the first thin-film transistor is lower than threshold voltage of the second thin-film transistor.

4. The device of claim 1, wherein the first insulating layer is one of a silicon nitride layer or a silicon oxynitride layer.

5. The device of claim 1, wherein the first thin-film transistor is one of a write transistor, a drive transistor or a reset transistor included in a pixel arranged in the pixel area.

6. The device of claim 5, wherein the second thin-film transistor is a protective transistor which protects the pixel area from electro-static discharge or an inspection transistor which inspects the pixel area.

7. The device of claim 1, including an organic electroluminescence display device, a liquid crystal display device or an imaging device.

8. An active matrix substrate using the device of claim 1.

9. A semiconductor device comprising:
an insulating substrate;
a first insulating layer which is provided on the insulating substrate and includes at least nitrogen;
a thin-film transistor which is provided above the first insulating layer and comprises a first oxide semiconductor layer;
a capacitor which is provided above the first insulating layer and comprises a second oxide semiconductor layer; and
a second insulating layer, wherein the second insulating layer comprises a first portion between the first insulating layer and the first oxide semiconductor layer of the thin-film transistor, and the second insulating layer comprises a second portion having a different thickness than the first portion.

10. The device of claim 9, wherein
the first insulating layer is uniform under the first oxide semiconductor layer and the second oxide semiconductor layer, and
the second insulating layer is between the first insulating layer and the second oxide semiconductor layer, and
the second insulating layer under the first oxide semiconductor layer is thicker than that under the second oxide semiconductor layer.

11. The device of claim 9, wherein electrical resistance of the second oxide semiconductor layer is lower than electrical resistance of the first oxide semiconductor layer.

12. The device of claim 9, wherein the first insulating layer is one of a silicon nitride layer or a silicon oxynitride layer.

13. The device of claim 9, wherein
the insulating substrate includes a pixel area, and
the thin-film transistor is one of a write transistor, a drive transistor or a reset transistor included in a pixel arranged in the pixel area.

14. The device of claim 13, wherein the capacitor is a capacitance element included in the pixel arranged in the pixel area.

15. The device of claim 9, including an organic electroluminescence display device, a liquid crystal display device or an imaging device.

16. An active matrix substrate using the device of claim 9.

17. A semiconductor device comprising:
an insulating substrate including a pixel area and a peripheral circuit area around the pixel area;
a first insulating layer which is provided on the insulating substrate and includes at least nitrogen;
a second insulating layer provided on the first insulating layer;
a first thin-film transistor which is provided on the second insulating layer in the pixel area and comprises a first oxide semiconductor layer; and
a second thin-film transistor which is provided on the second insulating layer in the peripheral circuit area and comprises a second oxide semiconductor layer, wherein
the first insulating layer in the pixel area is thicker than that in the peripheral circuit area.

18. The device of claim 17, wherein the second insulating layer is uniform in the pixel area and the peripheral circuit area.

19. A semiconductor device comprising:
an insulating substrate;
a first insulating layer which is provided on the insulating substrate and includes at least nitrogen;
a second insulating layer provided on the first insulating layer;
a thin-film transistor which is provided on the second insulating layer and comprises a first oxide semiconductor layer; and
a capacitor which is provided on the second insulating layer and comprises a second oxide semiconductor layer, wherein
the first insulating layer under the first oxide semiconductor layer is thinner than that under the second oxide semiconductor layer.

20. The device of claim 19, wherein the second insulating layer is uniform under the first oxide semiconductor layer and the second oxide semiconductor layer.

* * * * *